United States Patent [19]

Takahashi et al.

[11] Patent Number: 5,604,697
[45] Date of Patent: Feb. 18, 1997

[54] SEMICONDUCTOR

[75] Inventors: Tsugio Takahashi, Ome; Goro Kitsukawa, Hinode; Takesada Akiba, Tachikawa; Yasushi Kawase, Kokubunji; Masayuki Nakamura, Nagoya, all of Japan

[73] Assignees: Hitachi, Ltd., Tokyo; Hitachi Device Engineering Co., Ltd., Chiba, both of Japan

[21] Appl. No.: 574,104

[22] Filed: Dec. 20, 1995

[30] Foreign Application Priority Data

Dec. 20, 1994 [JP] Japan .................................. 6-334950

[51] Int. Cl.⁶ .................................................. G11C 13/00
[52] U.S. Cl. ...................................... 365/182; 365/230.03
[58] Field of Search ....................... 365/51, 182, 189.05, 365/189.01, 189.03, 189.04, 189.08, 230.01, 230.03, 230.05

[56] References Cited

U.S. PATENT DOCUMENTS

| | | |
|---|---|---|
| 4,590,588 | 5/1986 | Itoh et al. . |
| 4,658,377 | 4/1987 | McElroy ..................................... 365/51 |
| 5,140,550 | 8/1992 | Miyaoka et al. . |
| 5,274,595 | 12/1993 | Seok et al. . |
| 5,282,175 | 1/1994 | Fujita et al. . |
| 5,297,102 | 3/1994 | Tanizaki . |
| 5,301,142 | 4/1994 | Suzuki et al. . |
| 5,404,338 | 4/1995 | Murai et al. . |

FOREIGN PATENT DOCUMENTS

| | | |
|---|---|---|
| 1-245489 | 9/1989 | Japan . |
| 2-18785 | 1/1990 | Japan . |
| 2-158995 | 6/1990 | Japan . |
| 4-59712 | 9/1992 | Japan . |
| 5-54634 | 3/1993 | Japan . |

OTHER PUBLICATIONS

T. Sugibayashi et al., "A 30ns 256Mb DRAM with Multi-Divided Array Structure", 1993 IEEE Int'l Solid-State Circuits Conference, pp. 50–51.

Primary Examiner—Terrell W. Fears
Attorney, Agent, or Firm—Antonelli, Terry, Stout & Kraus, LLP

[57] ABSTRACT

A semiconductor memory such as a dynamic RAM having memory mats each divided into a plurality of units or sub-memory mats. Each sub-memory mat comprises: a memory array having sub-word lines and sub-bit lines intersecting orthogonally and dynamic memory cells located in lattice fashion at the intersection points between the intersecting sub-word and sub-bit lines; a sub-word line driver including unit sub-word line driving circuits corresponding to the sub-word lines; a sense amplifier including unit amplifier circuits and column selection switches corresponding to the sub-bit lines; and sub-common I/O lines to which designated sub-bit lines are connected selectively via the column selection switches. The sub-memory mats are arranged in lattice fashion. Above the sub-memory mats is a layer of: main word lines and column selection signal lines intersecting orthogonally, the main word lines having a pitch that is an integer multiple of the pitch of the sub-word lines, the column selection signal lines having a pitch that is an integer multiple of the pitch of the sub-bit lines; and main common I/O lines to which designated sub-common I/O lines are connected selectively.

23 Claims, 22 Drawing Sheets

CROSS-SECTION TAKEN ON LINE A-B

CROSS-SECTION TAKEN ON LINE B-C

CROSS-SECTION TAKEN ON LINE D-E

■ : $P^+$ DIFFUSION LAYER      ▫ : $N^+$ DIFFUSION LAYER

VCH=+4V   VCC=+3.3V   VSS=0V   VB1=-1V   VBB=-2V

CROSS-SECTION TAKEN ON LINE F-G

CROSS-SECTION TAKEN ON LINE G-H

CROSS-SECTION TAKEN ON LINE I-J

▬ : P+ DIFFUSION LAYER   ▭ : N+ DIFFUSION LAYER
VCH=+4V  VCC=+3.3V  VSS=0V  VB1=-1V  VBB=-2V

CROSS-SECTION TAKEN ON LINE K-L

CROSS-SECTION TAKEN ON LINE L-M

CROSS-SECTION TAKEN ON LINE N-O

▬ : P⁺ DIFFUSION LAYER    ▭ : N⁺ DIFFUSION LAYER

VCH=+4V  VCC=+3.3V  VSS=0V  VB1=-1V  VBB=-2V

SEMICONDUCTOR

BACKGROUND OF THE INVENTION

The present invention relates to a semiconductor memory and, more particularly, to a large-capacity dynamic RAM (random access memory) and related techniques for making the memory larger, faster, more integrated and less expensive than before.

Data line dividing (i.e., layering) techniques are disclosed illustratively in U.S. Pat. Nos. 4,590,588, 5,301,142, 5,297, 102 and 5,404,338 as well as in Japanese Patent Laid-Open No. Hei 5-54634. Word line layering techniques are disclosed illustratively in U.S. Pat. Nos. 5,140,550 and 5,282, 175, and in Japanese Patents Laid-Open Nos. Hei 1-245489 and Hei 2-158995. Japanese Patent Laid-Open No. Hei 2-18785 discloses techniques for installing amplifier MOSFETs between complementary data lines and complementary common data lines.

There exist semiconductor memories such as the dynamic RAM having as its basic components memory arrays each including a plurality of word lines and bit lines intersecting orthogonally and a large number of dynamic memory cells located in lattice fashion at the intersection points between the intersecting word and bit lines. In recent years, dynamic RAMs have been getting larger in capacity and more integrated in scale at rapid pace. Varieties of techniques are being disclosed to accelerate the trend.

For instance, the so-called layered word line structure is proposed in "ISSCC (International Solid-State Circuits Conference) '93 Digest of Technical Papers, Session 3" (Feb. 24, 1993; pp. 50–51). The proposed structure (called the first conventional example hereunder) involves arranging main word lines in parallel with sub-word lines, the pitch between the main word lines being made an integer multiple of that between the sub-word lines. The arrangement is intended to enlarge the wiring pitch of a metal wiring layer constituting the main word lines and thereby to enhance the degree of circuit integration of dynamic RAMs. In another example (called a second conventional example), Japanese Patent Publication No. Hei 4-59712 discloses the so-called layered I/O structure in which designated bit lines are connected to main common I/O lines by way of relatively short sub-common I/O lines. The structure is intended to alleviate the loads on sense amplifiers and thereby speed up read operations of dynamic RAMs. In addition, U.S. Pat. No. 5,274, 595 issued on Dec. 28, 1993 discloses a method (a third conventional example) for connecting sub-common I/O lines to main common I/O lines via a plurality of summing direct sense type sub-amplifiers, the sub-amplifiers being located where word line shunts and sense amplifiers intersect. The disclosed method is intended to minimize the increase in the layout area for accommodating a plurality of sub-amplifiers while speeding up the operation of dynamic RAMs.

SUMMARY OF THE INVENTION

The first conventional example involving the layered word line structure is characterized by the presence of a self-boot type word line driving circuit for selectively driving sub-word lines in accordance with a row selection signal and a word line driving current supply signal. The row selection signal is transmitted over main word lines, and the word line driving current supply signal is transmitted over word line driving current supply signal lines intersecting the sub-word lines orthogonally. The fact that the word line driving circuit is a self-boot type means that it takes time to bring the word line driving current supply signal to the active level after the main word lines are driven to the active level. This poses constraints on the effort to improve the access time of dynamic RAMs in read mode. Because the common I/O lines are not layered, the load on the sense amplifiers increases, which hampers the improvement of access time. In the second conventional example involving the layered I/O structure, the word lines are not layered. This necessitates narrowing the wiring pitch of the metal wiring layer constituting the word lines, which in turn restricts the effort to boost the degree of circuit integration of dynamic RAMs. In the third conventional example, a plurality of summing direct sense type sub-amplifiers connect the sub-common I/O lines to the main common I/O lines. This example entails word shunt-based word line division but does not adopt any layered word line structure. This poses constraints on the attempts to boost the degree of circuit integration of dynamic RAMs. Because the sub-common I/O lines are identical in length to the main common I/O lines, the third conventional example does not constitute a substantially layered I/O structure.

In short, the conventionally fabricated dynamic RAMS adopt layered structures only partially and sporadically. A comprehensive layered structure covering all word lines, bit lines and common I/O lines has yet to be implemented. The fact that full benefits of the layered structure have yet to be practically appreciated discourages general attempts to boost the operating speed of dynamic RAMs, to enlarge their scale and to reduce their costs.

It is therefore an object of the present invention to provide a dynamic RAM taking full advantage of the benefits of the layered structure so that the semiconductor memory will be enhanced in operation speed, boosted in the degree of circuit integration and lowered in manufacturing cost.

Other objects, features and advantages of the present invention will become apparent in the following specification and accompanying drawings.

In carrying out the invention and according to one aspect thereof, there is provided a semiconductor memory such as a dynamic RAM having a memory mat divided into a plurality of units or sub-memory mats. Each sub-memory mat comprises: a memory array having sub-word lines and sub-bit lines intersecting orthogonally and dynamic memory cells located in lattice fashion at the intersection points between the intersecting sub-word and sub-bit lines; a sub-word line driver including unit sub-word line driving circuits corresponding to the sub-word lines; a sense amplifier including unit amplifier circuits and column selection switches corresponding to the sub-bit lines; and sub-common I/O lines to which designated sub-bit lines are connected selectively via the column selection switches. The sub-memory mats are arranged in lattice fashion. Above the sub-memory mats is a layer of: main word lines and column selection signal lines intersecting orthogonally, the main word lines having a pitch that is an integer multiple of the pitch of the sub-word lines, the column selection signal lines having a pitch that is an integer multiple of the pitch of the sub-bit lines; and main common I/O lines to which designated sub-common I/O lines are connected selectively. Each of the unit sub-word line driving circuits in the sub-word line driver is a CMOS static driving circuit comprising: a p-channel first MOSFET which is furnished interposingly between the sub-word line driving signal line and the corresponding sub-word line and of which the gate is connected to an inverted signal line of the corresponding main word line; an n-channel second MOSFET which is furnished interposingly between the sub-word line and a grounding potential and of which the gate is connected to an inverted signal line of the corresponding main word line; and an n-channel third MOSFET which is furnished in parallel with the first MOSFET and of which the gate is connected to an uninverted signal line of the corresponding main word line. The sub-main amplifiers for selectively connecting the designated sub-common I/O lines to the main common I/O lines are each a pseudo-direct sense type sub-amplifier comprising: a read differential MOSFET of which the gate is connected to the uninverted and inverted signal lines of the corresponding sub-common I/O line and of which the drain is connected to the inverted and uninverted signal lines of the corresponding main common I/O line; and a write switching MOSFET furnished interposingly between the uninverted signal lines as well as between the inverted signal lines of the sub-common and main common I/O lines. The sub-main amplifiers are located in the region where the sub-word line driver and the sense amplifier intersect.

In the semiconductor memory of the constitution outlined above, the CMOS static driving circuit in each of the unit sub-word line driving circuits drives simultaneously to the active level both a row selection signal transmitted over the main word lines and a sub-word line driving signal transmitted via the sub-word driving signal lines. This arrangement speeds up sub-word line selecting operations. Because the sub-main amplifiers are pseudo-direct sense type sub-amplifiers located in the region where the sub-word line driver and the sense amplifier intersect, the read operation of the semiconductor memory such as the dynamic RAM is boosted without any increase in the memory layout area. Furthermore, a comprehensive layered structure involving all word lines, bit lines and common I/O lines constitutes a semiconductor memory taking full advantage of the beneficial effects of the structure. This provides wholesale improvements in the operation speed, in the degree of circuit integration and in the scale of the semiconductor memory as well as sweeping reductions in its manufacturing cost.

DESCRIPTION OF THE PREFERRED EMBODIMENTS

Figure 1:
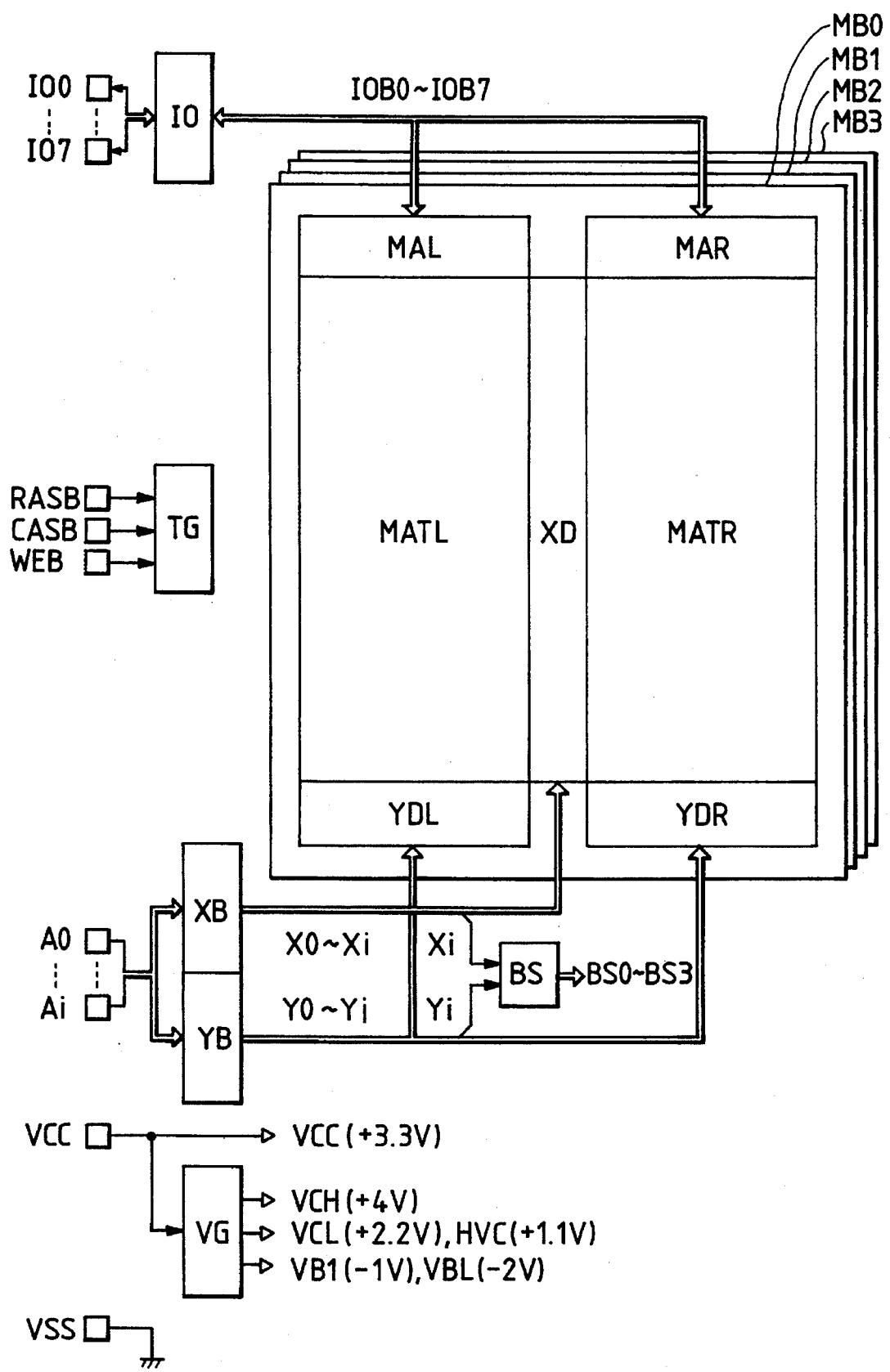
FIG. 1 is a block diagram of a dynamic RAM embodying the invention.

FIG. 1 is a block diagram of a dynamic RAM (semiconductor memory) embodying the invention. The constitution and operation of this embodiment will now be outlined with reference to FIG. 1. The circuit elements constituting each block in FIG. 1 are formed on one substrate composed illustratively of single crystal silicon through the use of known MOSFET integrated circuit fabrication techniques (MOSFET stands for a metal-oxide-semiconductor field-effect transistor which, in this specification, generically represents the insulated gate field-effect transistor). Unless otherwise noted, the names of terminals and signal lines in the accompanying drawings are also used to indicate the signals transmitted through these terminals and lines. In addition, each MOSFET with its channel (back gate) part arrowed in the accompanying circuit diagrams is a p-channel MOSFET as opposed to n-channel MOSFETs whose channel part is not arrowed.

The dynamic RAM in FIG. 1 has four memory blocks MB0 through MB3 as its basic components. These memory blocks, as exemplified by the memory block MB0 in FIG. 1, each comprise a pair of memory mats MATL and MATR flanking an X-address decoder XD, main amplifiers MAL and MAR corresponding to the memory mats, and Y-address decoders YDL and YDR also corresponding to the memory mats. The X-address decoder is supplied with internal address signals X0 through Xi of (i+1) bits from an X-address buffer XB. The Y-address decoders YDL and YDR are supplied commonly with internal address signals Y0 through Yi of (i+1) bits from a Y-address buffer YB. The X- and Y-address buffers XB and YB are fed on a time division basis with X-address signals AX0 through AXi and Y-address signals AY0 through AYi via address input terminals A0 through Ai. The main amplifiers MAL and MAR are connected via an eight-bit internal data bus IOB0–IOB7 to the I/O terminals on one side of the corresponding unit circuits of a data I/O circuit IO. The I/O terminals on the other side of these unit circuits are connected to the corresponding data I/O terminals IO0 through IO7.

Each of the memory mats MATL and MATR constituting each of the memory blocks MB0 through MB3 comprises 64 sub-memory mats arranged in lattice fashion, as will be discussed later. The sub-memory mats are each composed of a memory array having a predetermined number of sub-word lines and of sub-bit lines intersecting orthogonally and a large number of dynamic memory cells located in lattice fashion at the points of intersection between the sub-word and sub-bit lines; a sub-word line driver including unit sub-word line driving circuits corresponding to the sub-word lines of the memory array; a sense amplifier including unit amplifier circuits and column selection switches corresponding to the sub-bit lines; and sub-common I/O lines to which designated sub-bit lines are connected selectively via the column selection switches. Above the 64 sub-memory mats arranged in lattice fashion are main word lines originating from the X address decoder XD and bit line selection signals (column selection signal lines) originating from the Y-address decoder YDL or YDR, the main word lines and the column selection signal lines intersecting orthogonally. Also above the sub-memory mats are a predetermined number of main common I/O lines which are in parallel with the bit line selection signals and which originate from the main amplifier MAL or MAR. Specific constitutions, operations and layouts of the memory blocks MB0 through MB3 and of the sub-memory mats making up each memory block will be described later in more detail.

The X- and Y-address buffers XB and YB receive and retain the X-address signals AX0 through AXi or Y-address signals AY0 through AYi entered through the address input terminals A0 through Ai on a time division basis. On the basis of the X- or Y-address signals thus admitted, the X- and Y-address buffers XB and YB generate the internal address signals X0 through Xi or Y0 through Yi and supply the generated signals to the X-address decoder XD or Y-address decoder YDL or YDR of the memory blocks MB0 through MB3. The most-significant bit internal address signal Xi and Yi are also sent to a memory block selection circuit BS.

The X-address decoder decodes the internal address signals X0 through Xi from the X-address buffer XB, and drives the corresponding main word lines to the active level alternately. The Y-address decoders YDL and YDR decode the internal address signals Y0 through Yi from the Y-address buffer YB, and drive alternately the corresponding bits of the bit line selection signals to the active (i.e., selected) level. In this embodiment, each of the main word lines is constituted by complementary signal lines consisting of an uninverted and an inverted signal line. The main word lines have a pitch X times that of the sub-word lines constituting the sub-memory mat (i.e., eight-fold pitch), while the bit line selection signals have a pitch Y times that of the sub-bit lines (i.e., four-fold pitch). For this reason, the sub-word line driver of each sub-memory mat includes the unit sub-word line driving circuits for selectively driving the sub-word lines in accordance with the row selection signal and sub-word line driving signal; the row selection signal is transmitted over the corresponding 64-bit main word lines, and the sub-word line driving signal is transmitted via eight-bit sub-word line driving signal lines to be described later. Part of the internal address signals X0 through Xi fed to the X-address decoder XD are used to drive the sub-word line driving signals selectively to the active level. The sense amplifier of each sub-memory mat includes switching MOSFETs that are turned on selectively four pairs at a time when the corresponding bit line selection signals are driven to the active level, the activated switching MOSFETs connecting four pairs of complementary bit lines to the sub-common I/O lines selectively.

When the dynamic RAM is placed in write mode, the main amplifiers MAL and MAR take write data sent from the data I/O terminals IO0 through IO7 via the data I/O circuit IO and internal data bus IOB0–IOB7, and write the data thus supplied to eight selected memory cells in the designated sub-memory mat of the memory mat MATL or MATR. When the dynamic RAM is in read mode, the main amplifiers MAL and MAR amplify read signals which are output from eight selected memory cells in the designated sub-memory mat of the memory mat MATL or MATR and which are forwarded via the sub-common I/O lines (sub-common data lines), sub-main amplifiers and main common I/O lines (main common data lines); the amplified signals are then transmitted to the corresponding unit circuits in the data I/O circuit IO by way of the internal data bus IO0–IO7. From the unit circuits of the data I/O circuit IO, these read signals are sent to the outside of the dynamic RAM through the data I/O terminals IO0 through IO7.

The memory block selection circuit BS decodes the most-significant bit internal address signals Xi and Yi from the X and Y-address buffers XB and YB, and drives selectively memory block selection signals BS0 through BS3, not shown. These memory block selection signals are fed to the corresponding memory blocks MB0 through MB3 for selective activation thereof.

A timing generator TG generates selectively various internal control signals on the basis of a row address strobe signal RASB, a column address strobe signal CASB and a write enable signal WEB supplied externally as start control signals (in the description that follows, a character B suffixed to a signal name indicates that the signal is an inverted signal driven Low when made active). The internal control signals thus generated are supplied to various parts in the dynamic RAM. An internal voltage generator VG generates internal voltages VCH, VCL, HVC, VB1 and VB2 on the basis of a grounding potential VSS and a supply voltage VCC supplied externally as the operating power source. The internal voltages thus generated are fed to various parts in the dynamic RAM. The supply voltage VCC may be arranged to be, but is not limited to, a positive potential of +3.3 V. The internal voltage VCH is illustratively a positive potential of a relatively large absolute value (e.g., +4 V). The internal voltage HVC is illustratively +1.1 V, an intermediate potential between the internal voltage VCL and the grounding potential VSS. Furthermore, the internal voltage VB1 is a negative potential of a relatively small absolute value (e.g., −1 V), while the internal voltage VB2 is a negative potential of a relatively large absolute value (e.g., −2 V).

Figure 2:
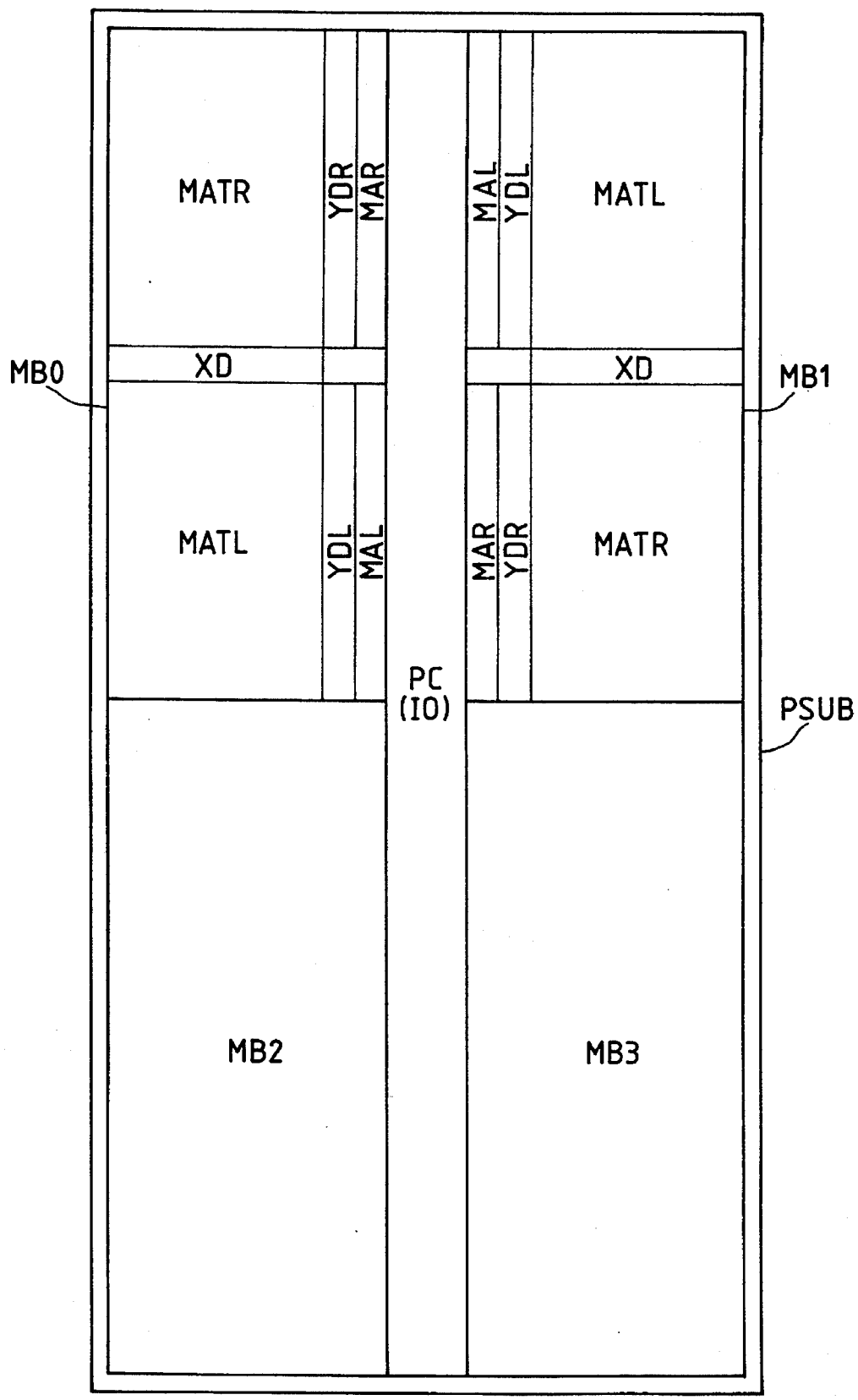
FIG. 2 is a substrate layout view of the dynamic RAM in FIG. 1.

FIG. 2 is a substrate layout view of the dynamic RAM in FIG. 1. The chip layout of the dynamic RAM embodying the invention will now be outlined with reference to FIG. 2. In the general description that follows regarding the chip layout, references of bearings (top, bottom, right, left) indicate the apparent positions in the relevant drawings.

In FIG. 2, the dynamic RAM is mounted on a p-type semiconductor substrate PSUB. The dynamic RAM as embodied here is of the so-called LOC (lead-on-chip) form in which the bonding pads for connecting inner leads to the semiconductor substrate PSUB are arranged linearly along the vertical center line of the substrate. Thus close to the bonding pads, i.e., at the center of the semiconductor substrate PSUB is a peripheral circuit PC including the X-address buffer XB, Y-address buffer YB and data I/O circuit IO. In the top left and the top right corner of the semiconductor substrate PSUB are the memory blocks MB0 and MB1, respectively. Under the memory blocks MB0 and MB1 are the memory blocks MB2 and MB3, respectively. These memory blocks are arranged so that the main common I/O lines and the sub-bit lines constituting part of each sub-memory mat are arranged horizontally as shown in FIG. 2, i.e., the Y-address decoders YDL and YDR and the main amplifiers MAL and MAR are inside the semiconductor substrate PSUB. As a result, the main word lines are in the vertical direction of FIG. 2 and in parallel with the sub-word lines constituting part of the sub-memory mats. The sub-common I/O lines constituting part of the sub-memory mats intersect the main common I/O lines orthogonally, in the vertical direction of FIG. 2. With the main amplifiers MAL and MAR located in the middle of the semiconductor substrate PSUB, the main common I/O lines connected to these amplifiers are arranged to intersect the sub-common I/O lines orthogonally. The arrangement provides an effective chip layout.

Figure 3:
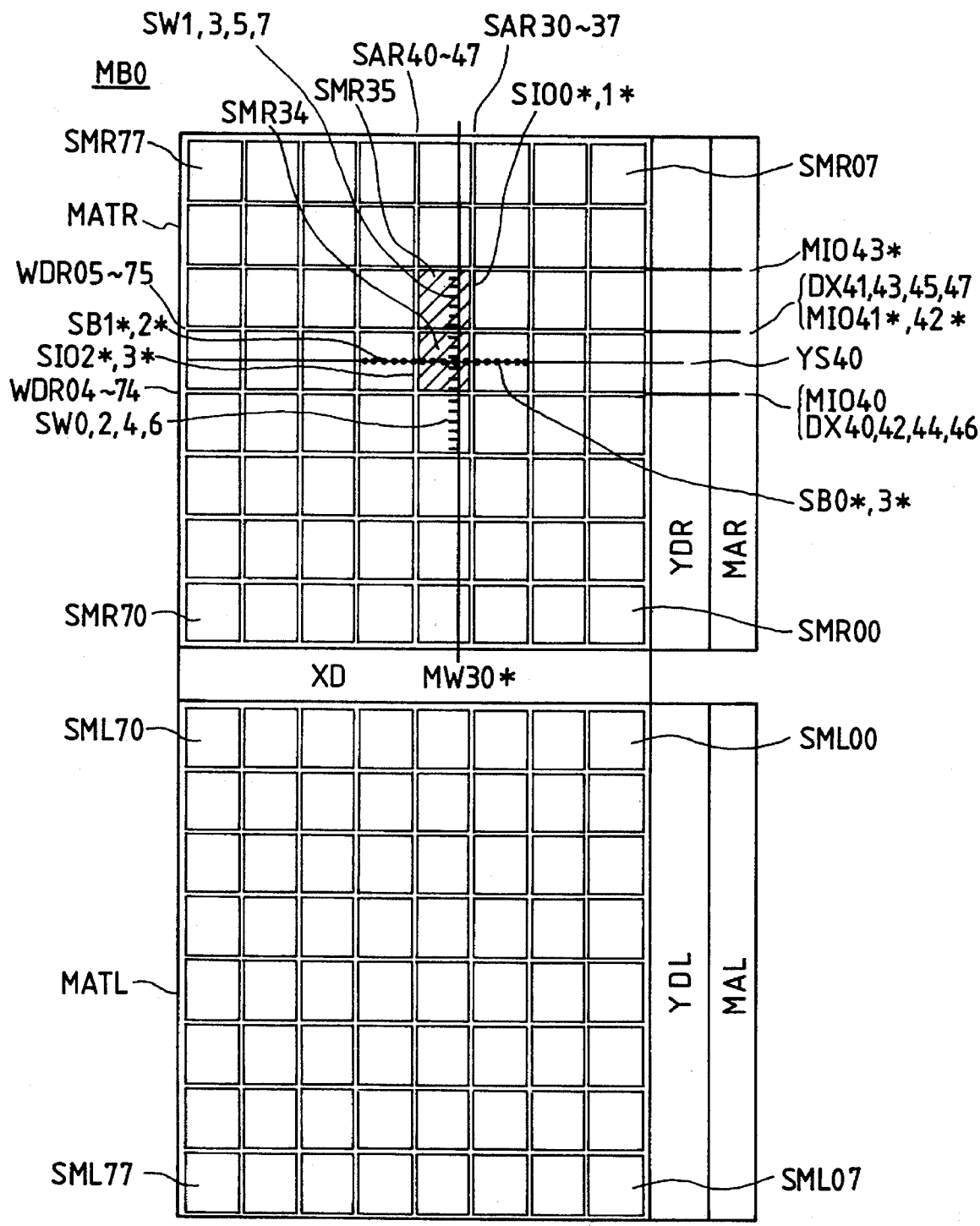
FIG. 3 is a block diagram of a memory block included in the dynamic RAM of FIG. 1.
Figure 4:
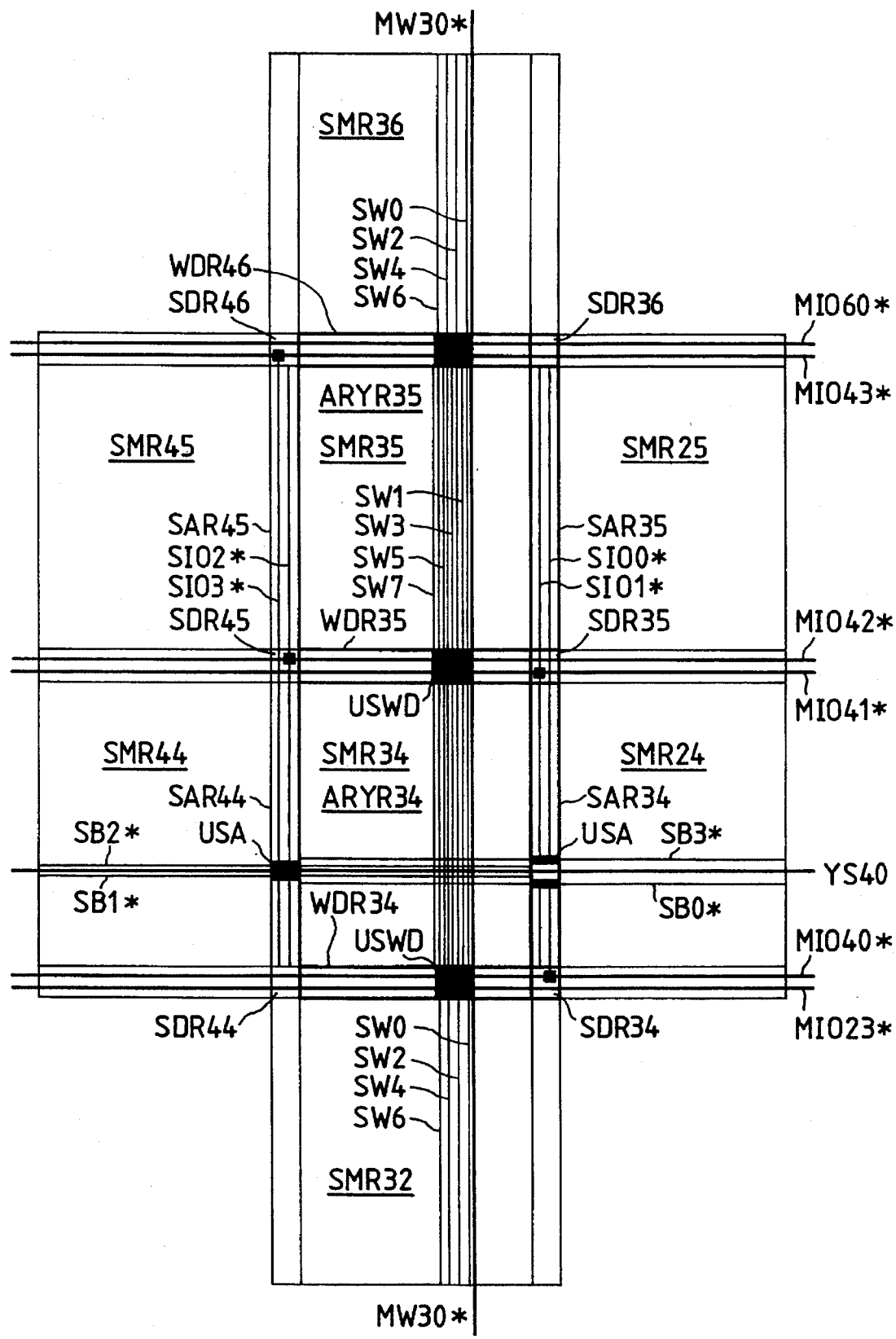
FIG. 4 is a partial block diagram of sub-memory mats included in the memory block of FIG. 3.
Figure 5:
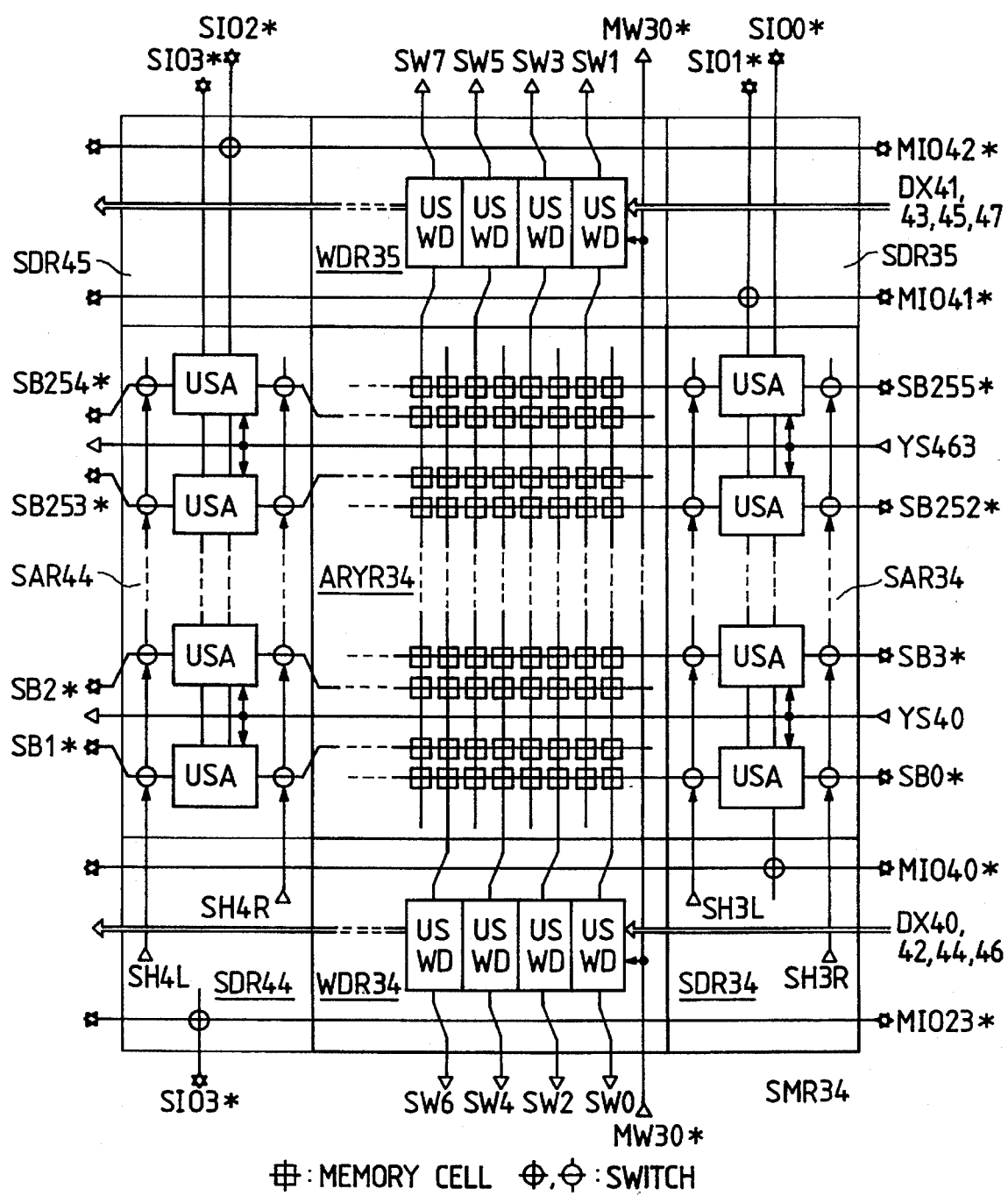
FIG. 5 is a partial connection diagram of the sub-memory mats in FIG. 4.
Figure 6:
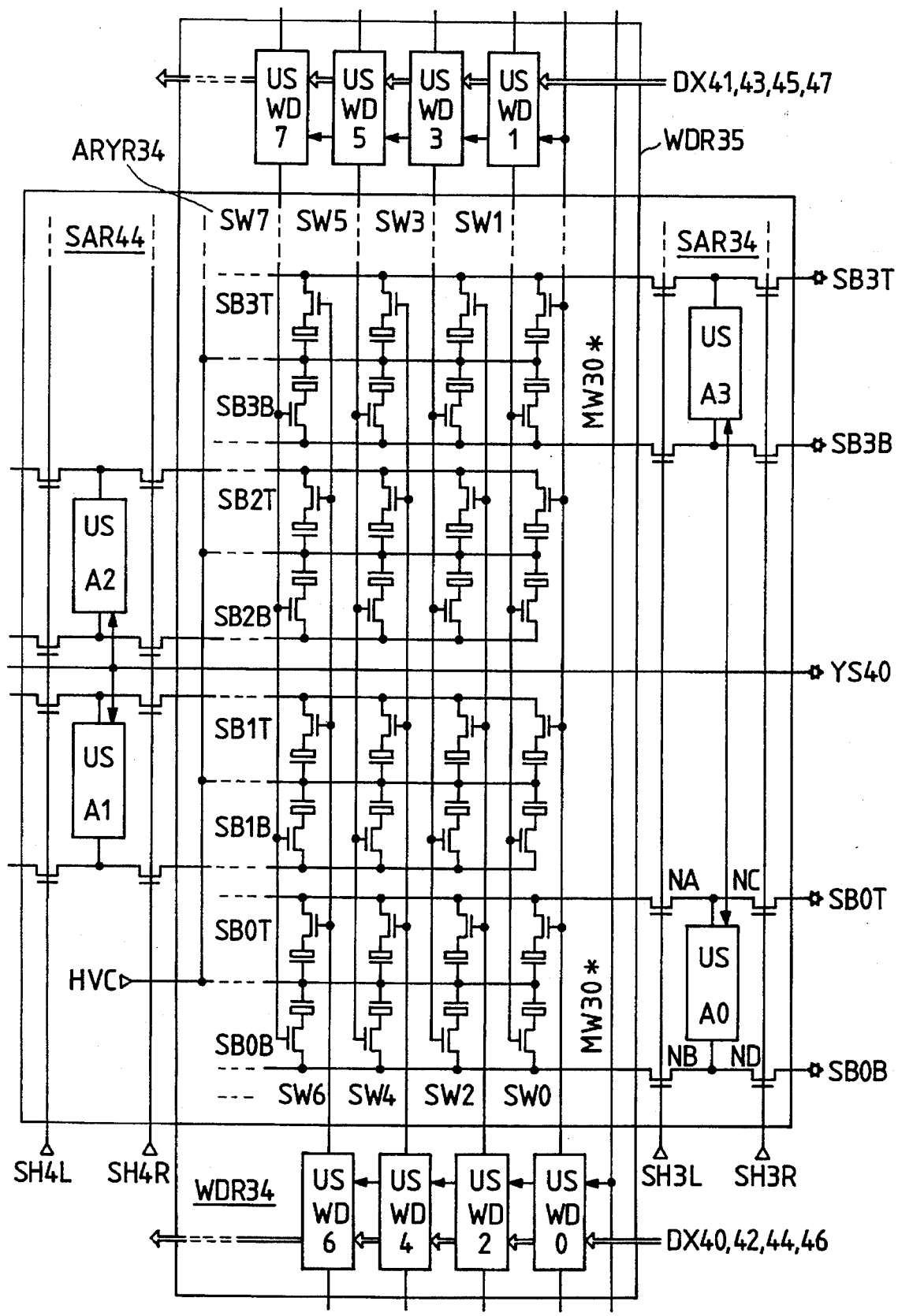
FIG. 6 is a partial circuit diagram of a memory array and peripherals included in the sub-memory mats of FIG. 4.

FIG. 3 is a block diagram of a memory block included in the dynamic RAM of FIG. 1. FIG. 4 is a partial block diagram of a sub-memory mat SMR34 and its peripherals included in the memory block of FIG. 3. FIG. 5 is a partial connection diagram of the setup in FIG. 4, and FIG. 6 is a partial circuit diagram of a memory array ARYR34 and its peripherals included in the sub-memory mat SMR34 of FIG. 4. With reference to these figures, mention will be made of: the block constitution of the memory blocks and sub-memory mats making up the dynamic RAM embodying the invention; specific structures of the memory arrays and their peripherals constituting the sub-memory mats; and some features of these memory components. The description that follows regarding the memory block constitution will refer primarily to the memory block MB0 but also apply to the other memory blocks MB1 through MB3 which are identical in structure to the memory block MB0. In addition, the description that follows with respect to the sub-memory mats, memory arrays and peripherals will center primarily on the sub-memory mat SMR34 but also apply to the other sub-memory mats SMR00 through SMR33 and SMR35 through SMR77 which are structurally identical to the sub-memory mat SMR34.

In FIG. 3, the memory block MB0 includes a pair of memory mats MATL and MATR flanking the X-address decoder XD as mentioned above. These memory mats are each composed of 64 sub-memory mats SML00 through SML77 and SMR00 through SMR77 arranged in 8×8 lattice fashion.

With this embodiment, the sub-memory mats SML00 through SML77 and SMR00 through SMR77 making up each of the memory mats MATL and MATR of the memory block MB0 are arranged so that two adjacent sub-memory mats in the column direction are paired to share four pairs of sub-common I/O lines SIO0* through SIO3*, as shown shaded in FIG. 3. (In the description that follows, an uninverted sub-common I/O line SIO0T and an inverted sub-common I/O line SIO0B are represented combinedly by an asterisk-suffixed notation such as a sub-common I/O line SIO0*. Each uninverted signal that is brought High when made active is identified by a character T suffixed to its name.) With such a paired sub-memory mat structure (e.g., SMR34 and SMR35), it is possible to remedy column-direction faults in units of the bit line selection signal. Meanwhile, eight pairs of sub-memory mats SMR04 through SMR74 and SMR05 through SMR75 (i.e., a total of eight sub-memory mats) arranged on the same row share four pairs of main common I/O lines (represented by the main common I/O lines MIO40* through MIO43*) and 64-bit bit line selection signals (represented by YS40 through YS463). Eight sub-memory mats (e.g., SMR30 through SMR37) arranged on the same row share 64 pairs of main word lines represented by MW30* through MW363. Part of the sub-memory mats SML00 through SML77 and SMR00 through SMR77 making up the memory mats MATL and MATR of each memory block may be furnished as redundant sub-memory mats in the row and column directions. These redundant sub-memory mats are used to remedy faults in units of the sub-memory mat.

The sub-memory mats SML00 through SML77 and SMR00 through SMR77 contain, as exemplified by the sub-memory mat SMR34 in FIG. 4, the memory array ARYR34, and the sub-word line driver WDR34 and sense amplifier SAR34 located respectively below and to the right of the memory array ARYR34. As shown in FIG. 6, the memory array ARYR34 effectively includes, and is not limited to, 512 sub-word lines SW0 through SW511 arranged vertically and 256 sub-bit lines SB0* through SB255* arranged horizontally in parallel. At the points of intersection between the sub-word lines and sub-bit lines are effectively 131,072 dynamic memory cells composed of data storage capacitors and address selection MOSFETs arranged in lattice fashion. In this setup, each of the sub-memory mats SML00 through SML77 and SMR00 through SMR77 has a storage capacity of 128 kilobits. Each of the memory blocks MB0 through MB3 has a storage capacity of 16 megabits (i.e., 128 kilobits×64×2). The dynamic RAM has a storage capacity of 64 megabits (i.e., 16 megabits×4).

As depicted in FIG. 6, the sub-word line driver WDR34 includes 256 unit sub-word line driving circuits USWD0, USWD2, . . . , USWD510 corresponding to even-numbered sub-word lines SW0, SW2, . . . , SW510 of the memory array ARYR34. The upper output terminals of these unit sub-word line driving circuits are connected to the corresponding even-numbered sub-word lines SW0, SW2, . . . , SW510 of the memory array ARYR34; the lower output terminals of the unit sub-word line driving circuits are connected to the corresponding even-numbered sub-word lines SW0, SW2, . . . , SW510 of the adjacent sub-memory mat SMR33. The upper output terminals of the unit sub-word line driving circuits USWD0, USWD2, . . . , USWD510 constituting the sub-word line driver WDR34 are interconnected every four terminals, and are coupled successively to the corresponding main word lines MW30* through MW363*. The lower output terminals of the unit sub-word line driving circuits USWD0, USWD2, . . . , USWD510 are interconnected every four terminals, and are coupled commonly to the corresponding sub-word line driving signal lines DX40, DX42, DX44 and DX46.

Meanwhile, the upper output terminals of the odd-numbered sub-word lines SW1, SW3, . . . , SW511 making up part of the memory array ARYR34 are connected to the output terminals of the corresponding unit sub-word line driving circuits USWD1, USWD3, ..., USWD511 of the sub-word line driver WDR35 in the adjacent sub-memory mat SMR35. The upper output terminals of these unit sub-word line driving circuits are in turn connected to the odd-numbered sub-word lines SW1, SW3, ..., SW511 constituting part of the memory array ARYR35 of the sub-memory mat SMR35. The upper input terminals of the unit sub-word line driving circuits USWD1, USWD3, ..., USWD511 making up the sub-word line driver WDR35 are interconnected every four terminals, and are coupled successively to the corresponding main word lines MW30* through MW363*: the lower input terminals of these unit sub-word line driving circuits are interconnected every four terminals, and are coupled commonly to the corresponding sub-word line driving signal lines DX41, DX43, DX45 and DX47.

The unit sub-word line driving circuits USWD0, USWD2, ..., USWD510 and USWD1, USWD3, ..., USWD511 of the sub-word line drivers WDR34 and WDR35 drive selectively to a predetermined selected level the corresponding sub-word lines SW0, SW2, ..., SW510 or SW1, SW3, .. ., SW511 of the memory arrays ARYR33 and ARYR34 or ARYR34 and ARYR35 on two conditions: that the corresponding main word lines MW30* through MW363* be driven to the active level, and that the corresponding sub-word line driving signals DX40, DX42, ..., DX46 or DX41, DX43, ..., DX47 be brought to the active level.

As described, in the dynamic RAM embodying the invention, 512 sub-word lines SW0 through SW511 making up part of, say, the sub-memory mat SMR34 are connected to the corresponding unit sub-word line driving circuits of a pair of sub-word line drivers WDR34 and WDR35 on both sides of (i.e., above and below) the sub-memory mat SMR34. Whereas the sub-memory mat SMR34 practically needs two sub-word line drivers, each unit sub-word line driving circuit of the sub-word line drivers is shared by the corresponding sub-bit lines of two sub-memory mats adjacent to each other in the column direction. Thus in this arrangement, the sub-word line drivers are made to correspond in serial numbers with the sub-memory mats. Where the memory array ARYR34 of the sub-memory mat SMR34 is taken as an example, the unit sub-word line driving circuits of the corresponding sub-word line drivers WDR34 and WDR35 are located alternately below or above the sub-word lines SW0 through SW511. Eight of the unit sub-word line driving circuits share corresponding one of the main word lines MW30* through MW363*. As a result, the unit sub-word line driving circuits may have a pitch twice that of the sub-word lines, and the main word lines may have a pitch eight times (X times) that of the sub-word lines. In this setup, the pitch of the unit sub-word line driving circuits and that of the complementary main word lines are relaxed, whereby the dynamic RAM may be enhanced in the degree of circuit integration and boosted in scale. More specific constitutions and operations of the unit sub-word line driving circuits USWD0 through USWD511 making up the sub-word line drivers WDR34 and others will be described later. The connections of these unit sub-word line driving circuits will be further clarified when FIGS. 3 through 5 are referenced.

The sub-bit lines SB0* through SB255* constituting part of the memory array ARYR34 in the sub-memory mat SMR34 are connected on the right-hand side to the corresponding unit circuits USA0, USA3, ..., USA252 and USA255 of the sense amplifier SAR34, by way of n-channel shared MOSFETs NA and NB commonly receiving through their gates a shared control signal SH3L. Likewise, the sub-bit lines SB0* through SB255* are connected on the left-hand side to the corresponding unit circuits USA1, USA2, ..., USA253 and USA254 of the sense amplifier SAR44 for the adjacent sub-memory mat SMR44, by way of shared MOSFETs commonly receiving through their gates a shared control signal SH4R. The unit circuits USA0, USA3, etc., of the sense amplifier SAR34 are further connected on the right-hand side to the corresponding sub-bit lines SB0*, SB3*, etc., of the memory array ARYR24 in the adjacent sub-memory mat SMR24, by way of n-channel shared MOSFETs NC and ND commonly receiving a shared control signal SH3R through their gates. The unit circuits USA1, USA2, etc., of the sense amplifier SAR35 are connected on the left-hand side to the corresponding sub-bit lines SB1*, SB2*, etc., of the memory array ARYR44, by way of shared MOSFETs commonly receiving a shared control signal SH4L through their gates.

Each unit circuit of the sense amplifiers SAR34 and SAR44 is fed commonly with consecutive four of the bit line selection signals YS40 through YS463. These unit circuits each contain a unit amplifier made of a pair of CMOS inverters in cross connection, and a pair of switching MOSFETs (column selection switches) commonly receiving through their gates the corresponding bit line selection signals YS40 through YS463. Each unit amplifier is selectively activated when supplied with the operating voltage via a common source line, not shown. The activated unit amplifier provides a binary read signal (High or Low level) by amplifying a small read signal output via the corresponding sub-bit line from the memory cell connected to the selected sub-word line. The switching MOSFETs of the sense amplifier unit circuits are turned on selectively four pairs at a time when the corresponding bit line selection signals YS40 through YS463 are driven to the active level. The activated MOSFET pairs selectively connect the corresponding four of the sub-bit lines of the memory array ARYR34 to the sub-common I/O lines SIO0* through SIO3*.

As shown in FIG. 4, the sub-common I/O lines SIO0* and SIO1* are shared by two sub-memory mats SMR34 and SMR35 contiguous in the column direction. The two sub-common I/O lines SIO0* and SIO1* are located to the right of these sub-memory mats, i.e., inside the sense amplifiers SAR34 and SAR35. The other two sub-common lines SIO2* and SIO3* are located to the left of these sub-memory mats, i.e., inside the sense amplifiers SAR44 and SAR45. Furthermore, the sub-common I/O line SIO0* is connected selectively to the main common I/O line MIO40* via a sub-main amplifier SMA of the sense amplifier driver SDR34 located bottom left of the sub-memory mat SMR34. The sub-common I/O line SIO1* is connected selectively to the main common I/O line MIO41* via the sub-main amplifier of the sense amplifier driver SDR35 in the cross region located bottom right of the sub-memory mat SMR35. The sub-common I/O line SIO2* is connected selectively to the main common I/O line MIO42* via the sub-main amplifier of the sense amplifier driver SDR45 located bottom right of the sub-memory mat SMR45. The sub-common I/O line SIO3* is connected selectively to the main common I/O line MIO43* via the sub-main amplifier of the sense amplifier driver SDR46 located bottom right of the sub-memory mat SMR46.

As described, in the dynamic RAM of this embodiment, 256 sub-bit lines SB0* through SB255* constituting part of the sub-memory mat SMR34 are connected illustratively to the corresponding unit circuits of a pair of sense amplifiers SAR34 and SAR44 flanking the sub-memory mat SMR34 (on the left and the right). Whereas the sub-memory mat SMR34 practically needs two sense amplifiers, each unit circuit of the sense amplifiers is shared by two sub-memory mats adjacent to each other in the row direction. Thus in this arrangement, the sense amplifiers are made to correspond in serial numbers with the sub-memory mats. Where the memory array ARYR34 of the sub-memory mat SMR34 is taken as an example, the unit circuits of the sense amplifiers are located alternately to the right or left of the sub-bit lines SB0* through SB255*. Each sense amplifier unit circuit shares four bit line selection signals YS40 through YS463. As a result, the sense amplifier unit circuits may have a pitch twice that of the sub-bit lines, and the bit line selection signals may have a pitch four times (Y times) that of the sub-bit lines. In this setup, the pitch of the sense amplifier unit circuits and that of the bit line selection signals are relaxed, whereby the dynamic RAM may be enhanced in the degree of circuit integration and boosted in scale. More specific constitutions of the sense amplifiers SAR34 and SAR44 and their unit circuits USA0 through USA255 will be described later. The connections of these circuit components will be further clarified when FIGS. 3 through 5 are referenced.

In the dynamic RAM of this invention, the memory mats MATL and MATR making up he memory blocks MB0 through MB3 are each divided into 64 units or sub-memory mats SML00 through SML77 or SMR00 through SMR77. As with the memory cells, these sub-memory mats are arranged in lattice fashion. The sub-word lines, sub-bit lines and sub-common I/O lines of the sub-memory mats are selectively connected to and activated by the main word lines, bit line selection signals or main common I/O lines furnished in the upper layer. As is already evident to those skilled in the art, dividing each memory mat into a large number of units or sub-memory mats enhances the degree of freedom of mat constitution in the dynamic RAM and thereby contributes to shortening the period of memory development. Because the division of memory mats into sub-memory mats is accompanied by the comprehensive layering of all word lines, bit lines and common I/O lines, the resulting dynamic RAM provides full benefits of the layered structure. Overall, the dynamic RAM of this constitution is faster in operation speed, higher in the degree of circuit integration, larger in scale and lower in fabrication cost than before.

Figure 7A:
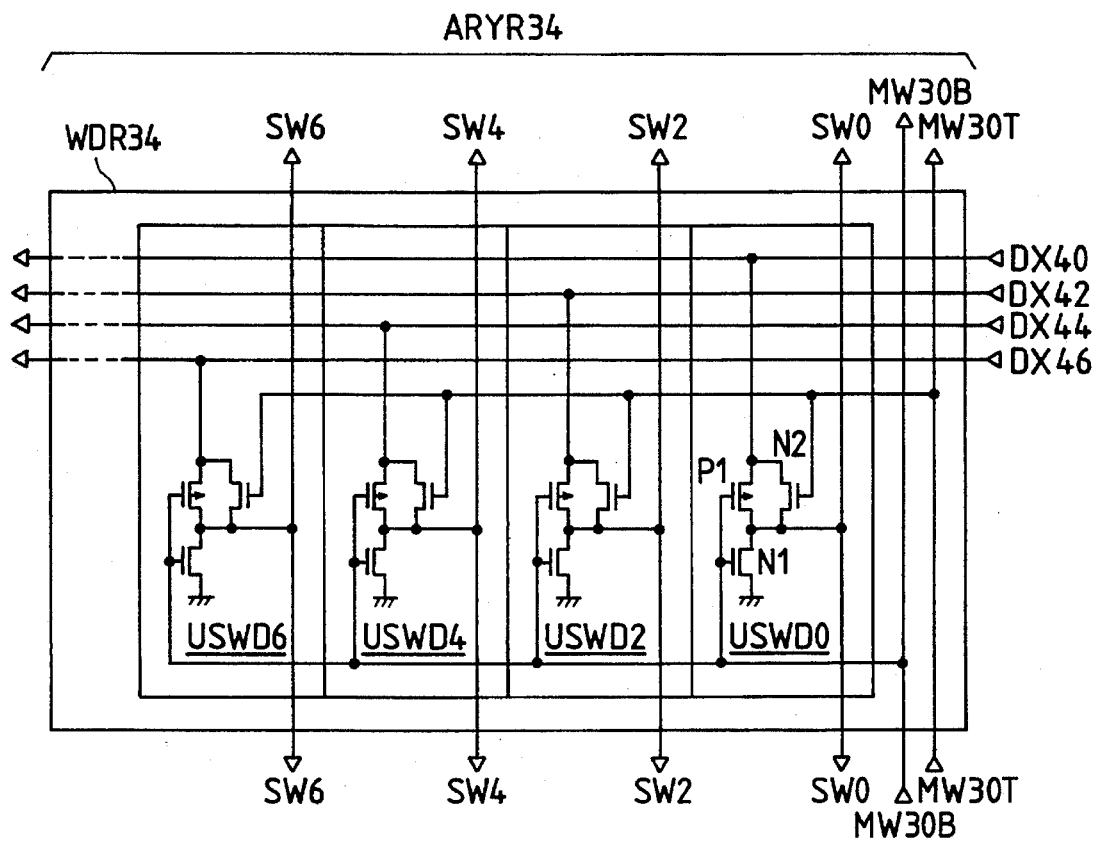
FIG. 7(A) and FIG. 7(B) are a set of a partial circuit diagram and a signal waveform diagram regarding a first example of a sub-word line driver included in the sub-memory mats of FIG. 4.
Figure 7B:
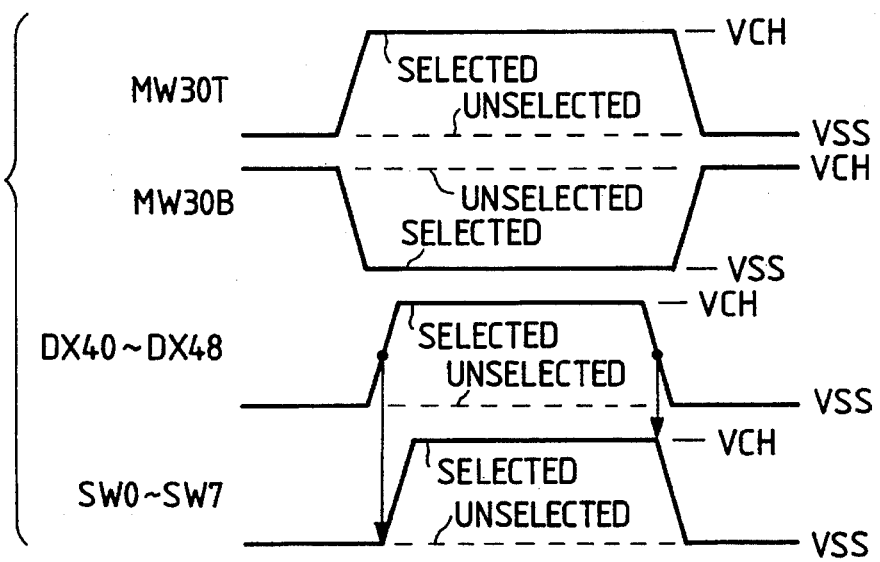
Figure 8A:
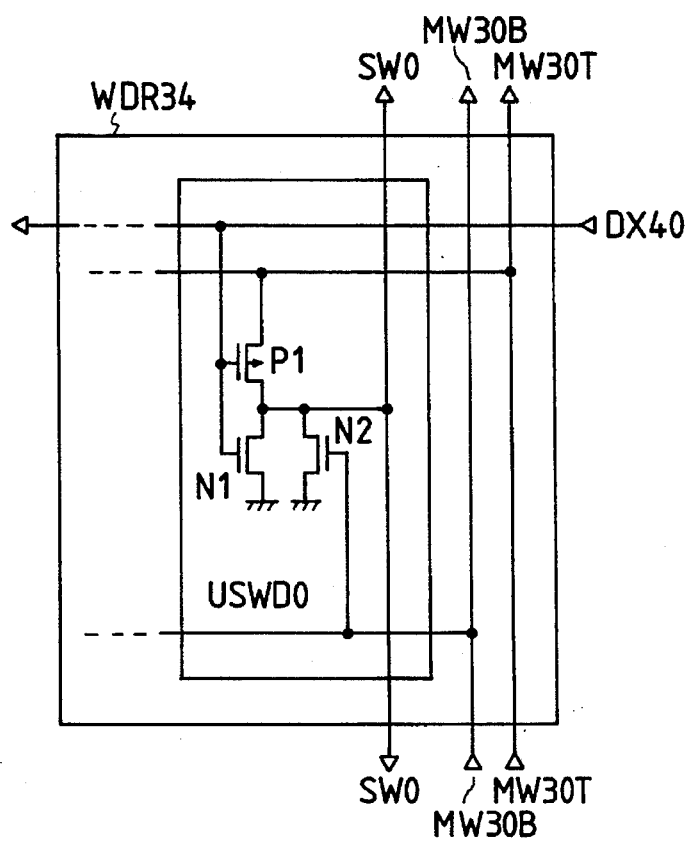
FIG. 8(A) and FIG. 8(B) are a set of a partial circuit diagram and a signal waveform diagram regarding a second example of a sub-word line driver included in the sub-memory mats of FIG. 4.
Figure 8B:
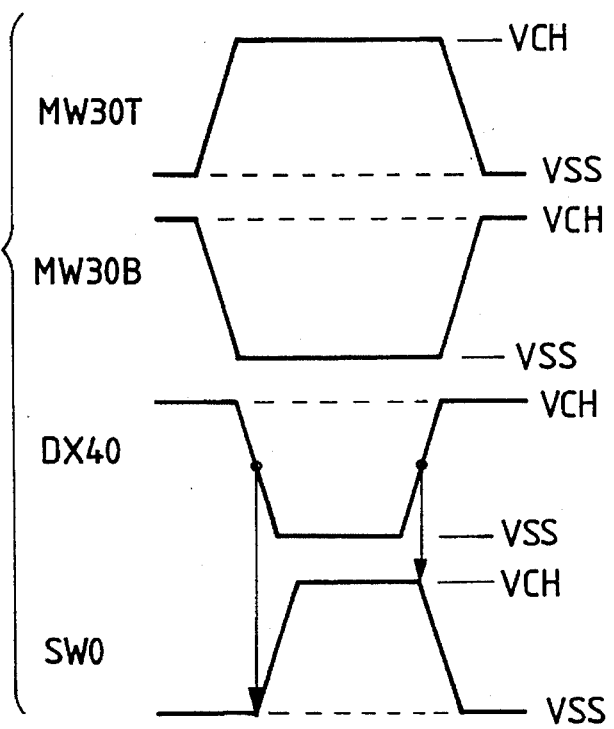
Figure 9A:
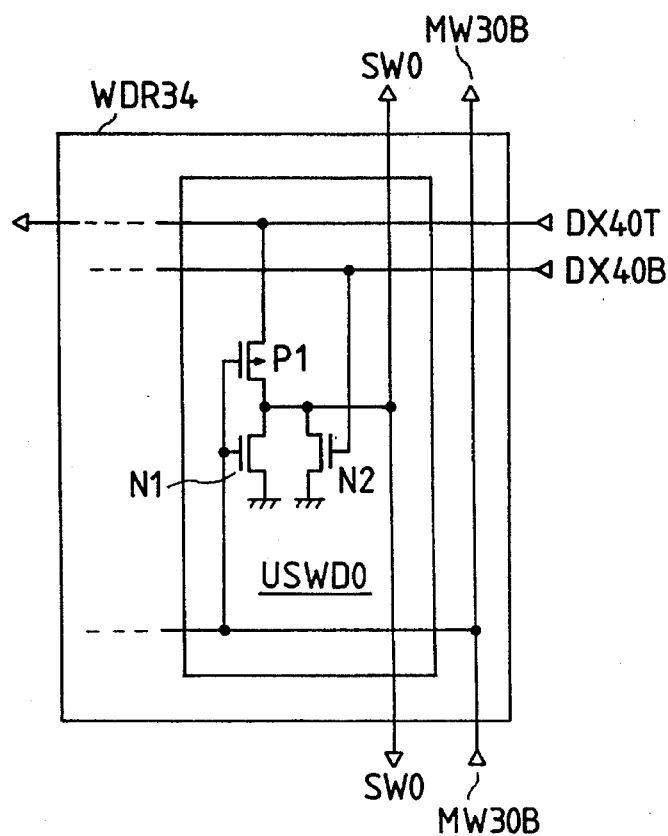
FIG. 9(A) and FIG. 9(B) are a set of a partial circuit diagram and a signal waveform diagram regarding a third example of a sub-word line driver included in the sub-memory mats of FIG. 4.
Figure 9B:
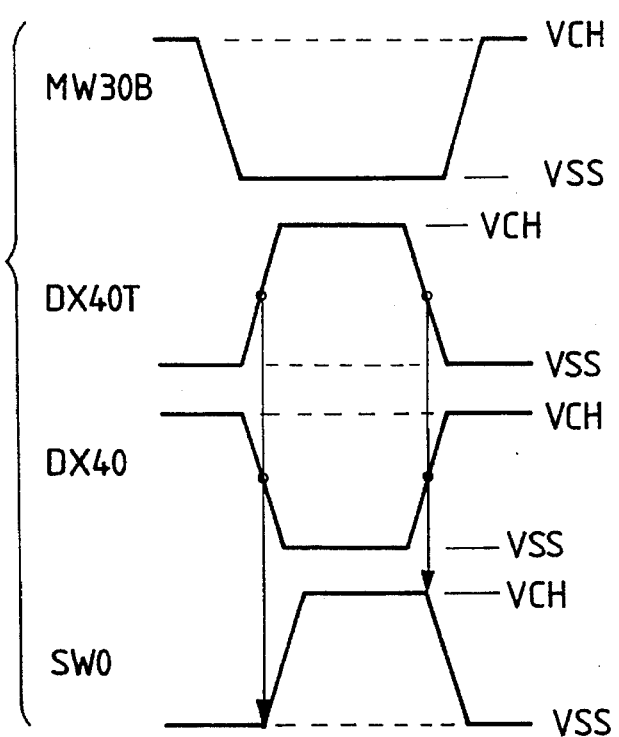

FIG. 7(A) and FIG. 7(B) show a partial circuit diagram and a signal waveform diagram regarding a first example of the sub-word line driver WDR34 in the sub-memory mat SMR34 of FIG. 4, respectively. FIG. 8(A) and FIG. 8(B) depict a partial circuit diagram and a signal waveform diagram regarding a second example of the sub-word line driver WDR34 in the sub-memory mat SMR34, respectively. FIG. 9(A) and FIG. 9(B) indicate a partial circuit diagram and a signal waveform diagram regarding a third example of the sub-word line driver WDR34, respectively. Described below with reference to FIGS. 7(A) through 9(B) are specific constitutions and operations of the sub-word line drivers making up part of the sub-memory mats of the dynamic RAM of this embodiment. The description that follows regarding the sub-word line driver arrangement will refer primarily to the sub-word line driver WDR34 of the sub-memory mat SMR34 but also apply to the other sub-word line drivers which are identical in structure to the sub-word line driver WDR34. In addition, the description that follows with respect to the unit sub-word line driving circuits USWD0 through USWD510 constituting the sub-word line driver WDR34 will center primarily on the unit sub-word line driving circuit USWD0 but also apply to the other unit sub-word line driving circuits USWD2 through USWD510 which are structurally identical to the unit sub-word line driving circuit USWD0.

In FIG. 7(A), the sub-word line driver WDR34 includes 256 unit sub-word line driving circuits USWD0, USWD2, . . . , USWD510 corresponding to the even-numbered sub-word lines SW0, SW2, . . . , SW510 making up part of the memory array ARYR34. Each of the unit sub-word line driving circuits, as exemplified by the unit sub-word line driving circuit USWD0, comprises a p-channel MOSFET P1 (first MOSFET) interposed between the corresponding sub-word line driving signal line DX40 and sub-word line SW0, and an n-channel MOSFET N1 (second MOSFET) interposed between the corresponding sub-word line SW0 and grounding potential VSS. The gates of the MOSFETs P1 and N1 are connected to the inverted signal line of the corresponding main word line MW30*, i.e., to the inverted main word line MW30B. The unit sub-word line driving circuit USWD0 further includes an n-channel MOSFET N2 (third MOSFET) arranged in parallel with the MOSFET P1. The gate of the MOSFET N2 is connected to the uninverted signal line of the corresponding main word line MW30*, i.e., to the uninverted main word line MW30T.

The uninverted main word line MW30T is brought to the inactive level such as 0 V (grounding potential VSS) when not selected, and driven to the active level such as +4 V (internal voltage VHC) when selected. The inverted main word line MW30B is brought to the inactive level such as the internal voltage VCH when not selected, and driven to the active level such as the grounding potential VSS when selected. The sub-word line driving signal DX40 is brought to the inactive level such as the grounding potential VSS when not selected, and driven to the active level such as the internal voltage VCH when selected. As mentioned above, the internal voltage VCH, a relatively stable potential of +4 V, is generated by the internal voltage generator VG in the dynamic RAM drawing on the supply voltage VCC.

When the corresponding uninverted main word lines MW30T and inverted main word lines MW30B are brought to the inactive level, the MOSFETs P1 and N2 are both turned off and the MOSFET N1 is turned on in the unit sub-word line driving circuit USWD0. Thus the sub-word line SW0 is set to the unselected level such as the grounding potential VSS irrespective of the level of the corresponding sub-word line driving signal DX40.

Meanwhile, when the corresponding uninverted main word line MW30T and inverted main word line MW30B are driven to the active level, the MOSFET N1 is turned off and the MOSFETs P1 and N2 are turned on in the unit sub-word line driving circuit USWD0. Thus the sub-word line WS0 is brought to the selected level such as the internal voltage VCH upon receipt of the active level of the corresponding sub-word line driving signal DX40, and is driven to the unselected level such as the grounding potential VSS when receiving the inactive level of the sub-word line driving signal DX40.

As described, the unit sub-word line driving circuits USWD0 and others constituting the sub-word line drivers WDR34, etc., in the inventive dynamic RAM are not self-boot type but CMOS (complementary MOS) static driving circuits. In that case, the main word lines MW30* and others and the sub-word line driving signals DX40 and others may be driven to the active level simultaneously. This makes it possible to improve the access time of the dynamic RAM in its read mode.

As shown in FIG. 8(A), the unit sub-word line driving circuits exemplified by the circuit USWD0 are each composed of a p-channel MOSFET P1 and n-channel MOSFETs N1 and N2. The p-channel MOSFET P1 is interposed between the corresponding uninverted main word line MW30T and sub-word line SW0 and receives through its gate the sub-word line driving signal DX40. The n-channel MOSFETs N1 and N2 are interposed in parallel between the sub-word line SW0 and the grounding potential VSS and have their gates connected respectively to the corresponding sub-word line driving signal line DX40 and inverted main word line MW30B. Alternatively, as depicted in FIG. 9(A), the p-channel MOSFET P1 may be interposed between the corresponding uninverted sub-word line driving signal line DX40T and sub-word line SW0 and has its gate connected to the corresponding main word line MW30B; the n-channel MOSFETs N1 and N2 may be interposed in parallel between the sub-word line SW0 and the grounding potential VSS and have their gates connected respectively to the corresponding main word line MW30B and inverted sub-word line driving signal DX40B. The unit sub-word line driving circuit USWD0 may also be composed of an ordinary two-input CMOS NOR gate arrangement. In this case, the main word line and the sub-word line driving signal may be a single signal line each. The arrangement further reduces the number of necessary lines and contributes to enhancing the degree of circuit integration of the dynamic RAM.

Figure 10:
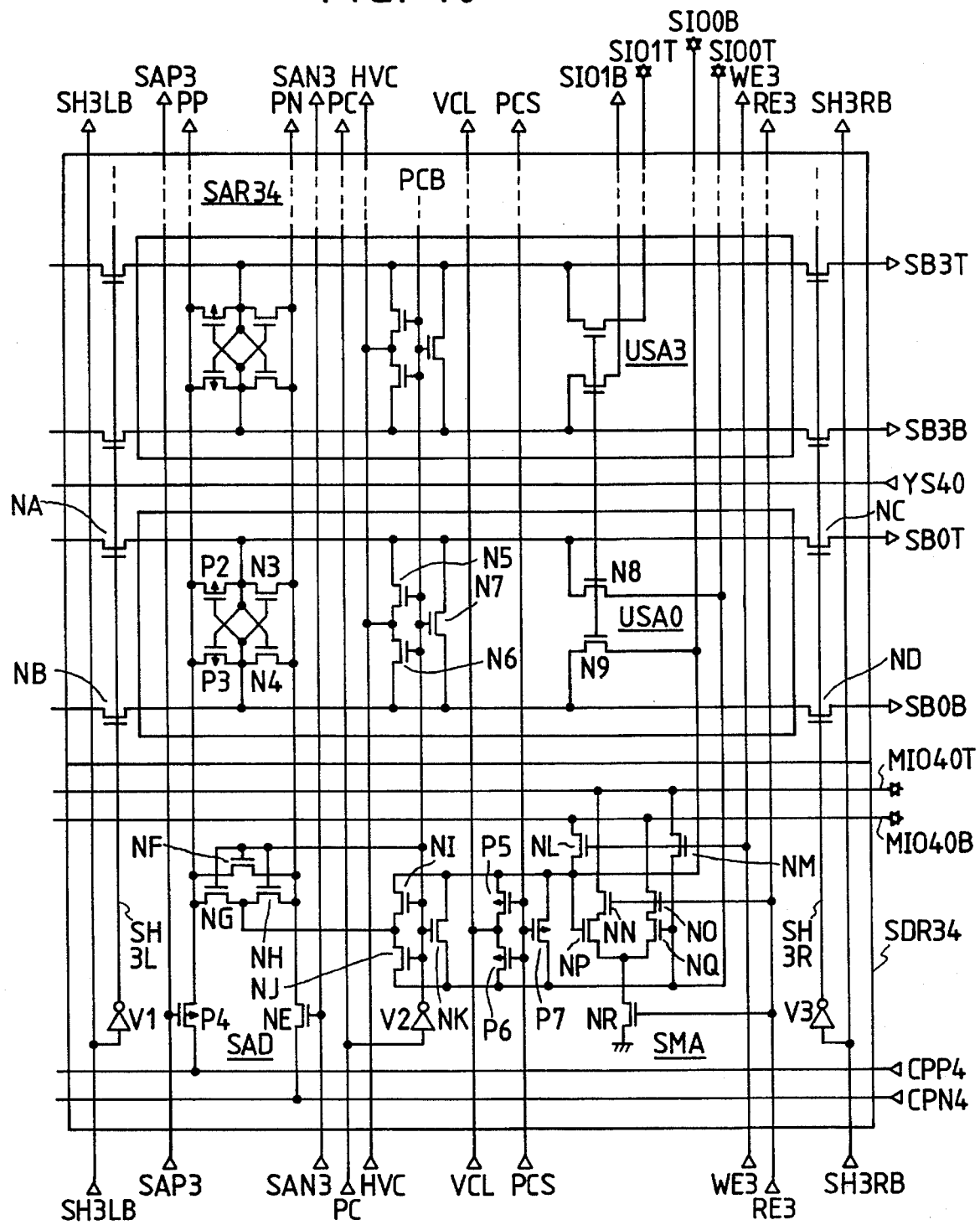
FIG. 10 is a partial circuit diagram of a first example of a sense amplifier and a first example of a sense amplifier driver included in the sub-memory mats of FIG. 4.
Figure 11:
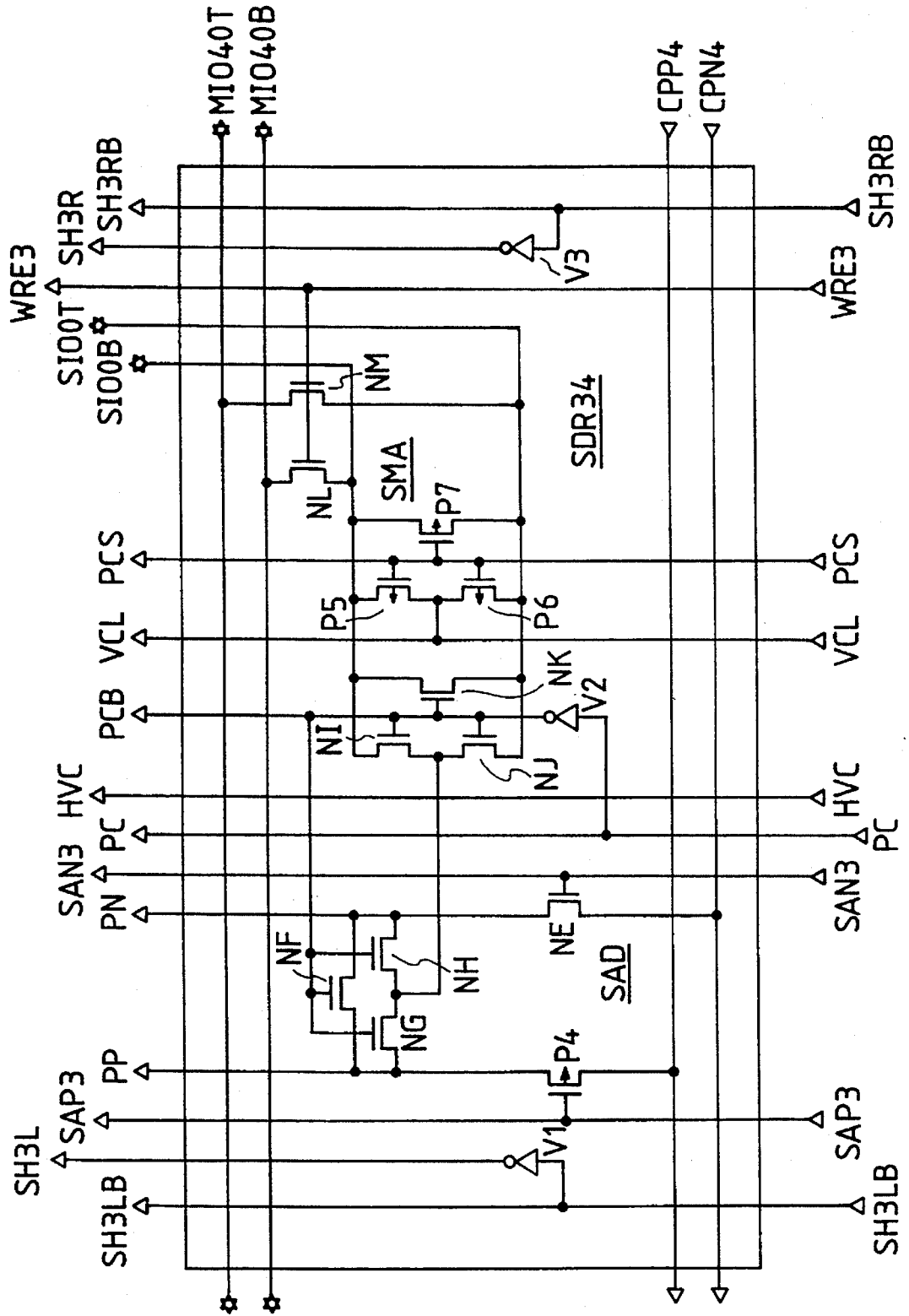
FIG. 11 is a partial circuit diagram of a second example of a sense amplifier driver included in the sub-memory mats of FIG. 4.
Figure 12:
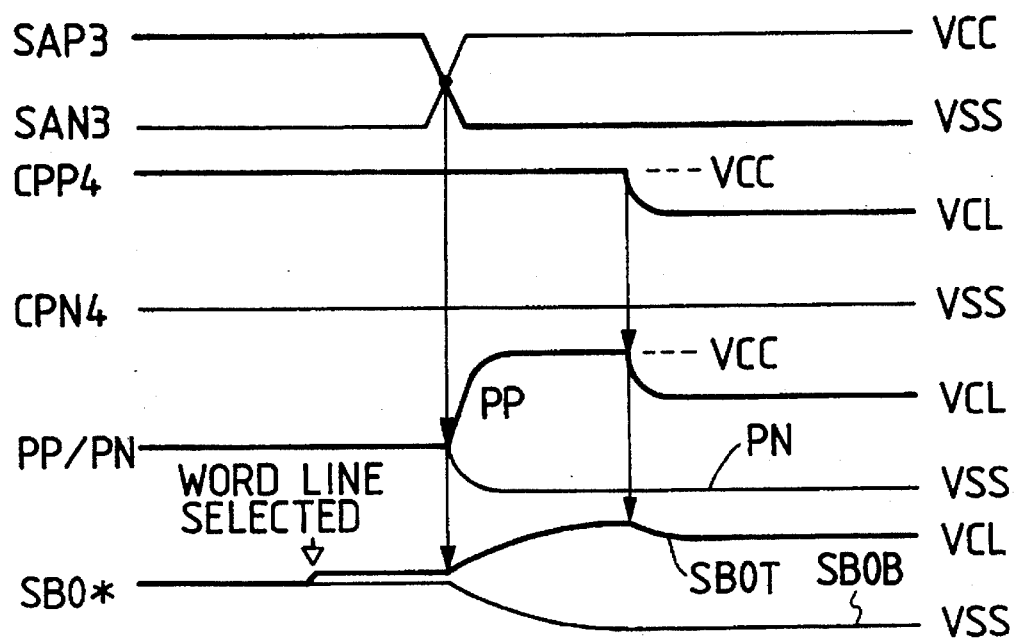
FIG. 12 is a signal waveform diagram regarding the sense amplifier driver in FIGS. 10 and 11.
Figure 14:
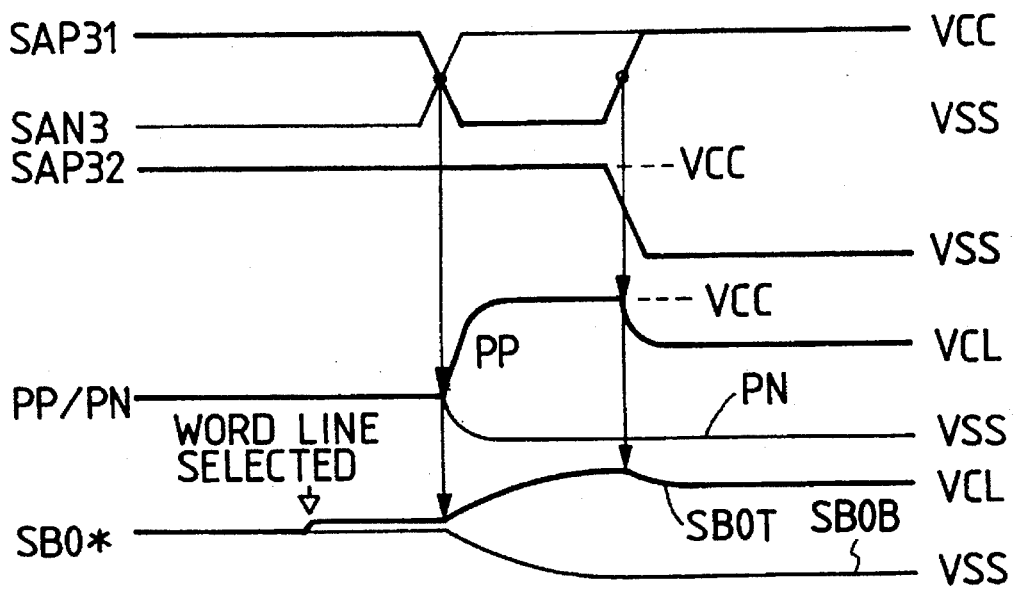
FIG. 14 is a signal waveform diagram regarding the sense amplifier driver in FIG. 13.
Figure 13:
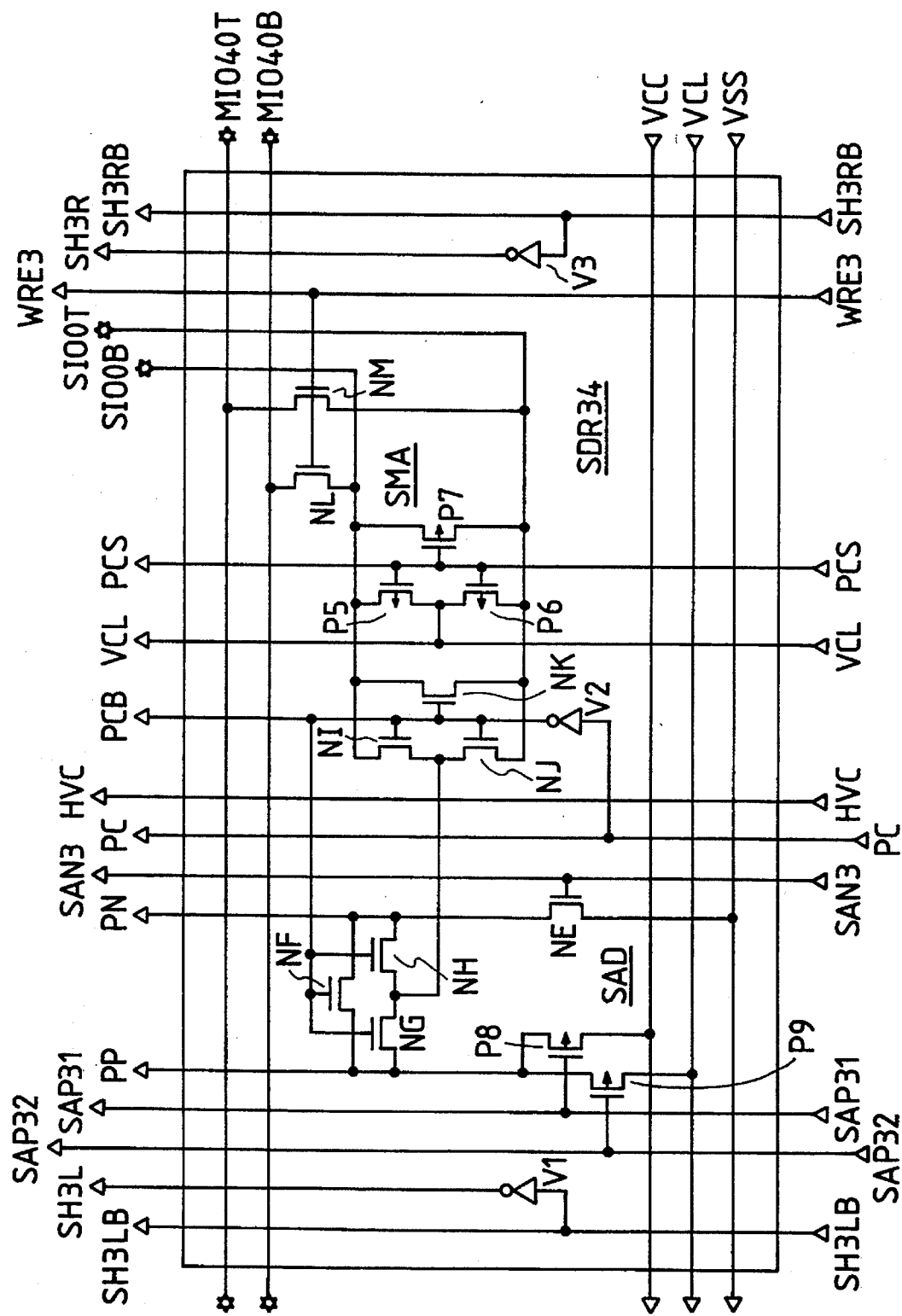
FIG. 13 is a partial circuit diagram of a third example of a sense amplifier driver included in the sub-memory mats of FIG. 4.

FIG. 10 is a partial circuit diagram of a first example of the sense amplifier SAR34 and a first example of the sense amplifier driver SDR34 included in the sub-memory mat SMR34 of FIG. 4. FIG. 11 is a partial circuit diagram of a second example of the sense amplifier driver SDR34 in the sub-memory mat SMR34 of FIG. 4. FIG. 12 is a signal waveform diagram regarding the sense amplifier driver SDR34 shown in FIGS. 10 and 11. FIG. 13 is a partial circuit diagram of a third example of the sense amplifier driver SDR34 in the sub-memory mat SMR34 of FIG. 4. FIG. 14 is a signal wave diagram regarding the sense amplifier driver SDR34. Described below with reference to FIGS. 10 through 14 are specific constitutions, operations and features of the sense amplifiers and sense amplifier drivers in the sub-memory mats of the inventive dynamic RAM. The description that follows regarding the sense amplifiers, their unit circuits and the sense amplifier drivers will center primarily on the sense amplifier SAR34 and its unit circuit USA0 in the sub-memory mat SMR34 as well as on the sense amplifier driver SDR34. These components explained as representative examples are identical in structure to those sense amplifiers, unit circuits and sense amplifier drivers which they represent and to which the ensuing description applies.

In FIG. 10, the sense amplifier SAR34 includes 128 unit circuits USA0, USA3, . . . , USA252 and USA255. The input terminals on the left-hand side of these unit circuits are connected to the corresponding sub-bit lines SB0*, SB3*, . . . , SB252* and SB255* of the memory array ARYR34, by way of n-channel shared MOSFETs NA and NB whose gates commonly receive an uninverted shared control signal SH3L that is obtained by an inverter V1 of the sense amplifier driver SR34 inverting an inverted shared control signal SH3LB. The input terminals on the right-hand side of the unit circuits are connected to the corresponding sub-bit lines SB0*, SB3*, . . . , SB252* and SB255* of the memory array ARYR24 in the adjacent sub-memory mat SMR24, by way of n-channel shared MOSFETs NC and ND whose gates commonly receive an uninverted shared control signal SH3R that is acquired by an inverter V3 of the sense amplifier driver SDR34 inverting an inverted shared control signal SH3RB.

The dynamic RAM of the above constitution adopts what is known as the shared sense scheme. That is, the unit circuits USA0, USA3, . . . , USA252 and USA255 of the sense amplifier SAR34 are shared by the memory arrays ARYR34 and ARYR24 of a pair of adjacent sub-memory mats SMR34 and SMR24. When the inverted shared control signal SH3LB is brought Low and the uninverted shared control signal SH3L is driven High, the sense amplifier unit circuits are selectively connected to the corresponding sub-bit lines SB0*, SB3*, . . . , SB252* and SB255* of the memory array ARYR34 located on the left-hand side, by way of the shared MOSFETs NA and NB. When the inverted shared control signal SH3RB is brought Low and the uninverted shared control signal SH3R is driven High, the sense amplifier unit circuits are selectively connected to the corresponding sub-bit lines SB0*, SB3*, . . . , SB252* and SB255* of the memory array ARYR24 located on the right-hand side, by way of the shared MOSFETs NC and ND.

Each of the unit circuits making up the sense amplifier SAR34, as exemplified by the unit circuit USA0 in FIG. 10, includes a unit amplifier and a bit line pre-charge circuit. The unit amplifier is composed of a p-channel MOSFET P2, an n-channel MOSFET N3, a p-channel MOSFET P3 and an n-channel MOSFET N4 constituting a pair of CMOS inverters in cross connection. The bit line pre-charge circuit is made up of a pair of n-channel switching MOSFETs (column selection switches) N8 and N9 interposed between the uninverted and the inverted I/O node of the unit amplifier on the one hand, and the uninverted and the inverted signal line of the sub-common I/O line SIO0* or SIO1* on the other, and three n-channel MOSFETs N5 through N7 in series-parallel connection.

The sources of the MOSFETs P2 and P3 constituting part of the unit amplifier are commonly connected to a common source line (driving signal line) PP; the sources of the MOSFETs N3 and N4 are commonly connected to a common source line PN. The common source line PP is connected to a driving voltage supply line CPP4 via a p-channel driving MOSFET P4 of the sense amplifier driving circuit SAD in the sense amplifier driver SDR34. The common source line PN is connected to a driving voltage supply line CPN4 via an n-channel driving MOSFET NE of the sense amplifier driving circuit SAD. Between the common source lines PP and PN is a common I/O line pre-charge circuit having three n-channel MOSFETs NF through NH in series-parallel connection. The gate of the driving MOSFET P4 in the sense amplifier driving circuit SAD is connected to a sense amplifier control signal line SAP3; the gate of the driving MOSFET NE is connected to a sense amplifier control signal line SAN3. The gates of the MOSFETs NF through NH in the common I/O line pre-charge circuit are commonly fed with an inverted internal control signal PCB that is obtained by an inverter V2 inverting an internal control signal PC for pre-charge control.

In the setup above, the unit amplifiers of the unit circuits in the sense amplifier SAR34 are selectively activated on two conditions: that the driving MOSFETs P4 and NE of the sense amplifier driving circuit SAD be turned on upon receipt of the active level of the sense amplifier control signals SAP3 and SAN3; and that predetermined operating power be supplied from the driving voltage supply lines CPC4 and CPN4 via the common source lines PP and PN. The activated unit amplifiers each provide a binary read signal (High or Low level) by amplifying a small read signal output via the corresponding sub-bit lines SB0* and SB2* from the 256 memory cells connected to the selected sub-word lines of the memory array ARYR34 or ARYR24.

The gates of the switching MOSFETs N8 and N9 constituting part of the unit circuits in the sense amplifier SAR34 are interconnected every two pairs and are supplied with the corresponding bit line selection signals YS40 and others from the Y-address decoder YD. As mentioned above, the bit line selection signals YS40, etc., are fed to the gates of two pairs of switching MOSFETs in the unit circuits USA1, USA2, etc., of the sense amplifier SAR44 located to the left of the memory array ARYR34. In this setup, the switching MOSFETs N8 and N9 in the unit circuits are selectively turned on two pairs at a time when the corresponding bit line selection signals YS40 through YS463 are driven to the active level. The activated switching MOSFETs selectively connect the corresponding two sub-bit lines to the sub-common I/O lines SIO0* and SIO1* in the memory array ARYR34 or ARYR24.

Meanwhile, the gates of the MOSFETs N5 through N7 constituting the bit line pre-charge circuit of each unit circuit in the sense amplifier SAR34 are commonly supplied with the inverted pre-charge control signal PCB. The MOSFETs N5 through N7 are selectively turned on upon receipt of the active (i.e., High) level of the inverted pre-charge control signal PCB. The activated MOSFETs N5 through N7 short-circuit (i.e., equalize) the uninverted and the inverted I/O node of the unit amplifier in the corresponding unit circuit of the sense amplifier SAR34, i.e., the uninverted and the inverted signal line of the corresponding sub-bit line for the memory array ARYR34 or ARYR24.

In this embodiment, the memory mats MATL and MATR making up the memory blocks MB0 through MB3 use as their operating power the internal voltage VCL of a relatively small absolute value (e.g., +2.2 V) and the grounding potential VSS (i.e., 0 V). This is intended to minimize in size the memory cells and other circuit elements. Likewise the unit amplifiers constituting the sense amplifier SAR34 utilize as the operating power the internal voltage VCL fed via the common source lines PP and PN as well as the grounding potential VSS. However, the dynamic RAM embodying the invention adopts what is known as the overdrive scheme under which the common source line PP is fed with the supply voltage VCC (i.e., +3.3 V) only for a predetermined initial period in which the sense amplifier SAR34 is activated. The scheme allows the unit amplifiers of the sense amplifier to act more quickly than before for amplifying operations thereby increasing the speed of reading data from the dynamic RAM.

The overdrive scheme of the sense amplifier will now be described briefly with reference to the signal waveform diagram of FIG. 12. As shown in FIG. 12, the sense amplifier control signal SAP3 is on the inactive level when set to the supply voltage VCC (i.e., +3.3 V) and on the active level when set to the grounding potential VSS (i.e., 0 V). The sense amplifier control signal SAN3 is on the inactive level when set to the grounding potential VSS and on the active level when set to the supply voltage VCC. The driving voltage supply line CPP4 is being fed with the supply voltage VCC when not selected as well as from the time the sense amplifier control signals SAP3 and SAN3 are brought to the active level until a predetermined time has elapsed. Upon elapse of the predetermined time, the driving voltage supply line CPP4 is supplied with the internal voltage VCL (i.e., +2.2 V). The driving voltage supply line CPN4 is always fed with the grounding potential VSS. The pre-charge control signal PC, not shown, is driven to the active level at a predetermined timing when the sense amplifier SAR34 is deactivated. The pre-charge control signal PC is brought to the inactive level when the sense amplifier SAR34 is activated.

When the sense amplifier control signals SAP3 and SAN3 are driven to the inactive level and when the sense amplifier SAR34 is deactivated, the driving MOSFETs P4 and NE in the sense amplifier driving circuit SAD of the sense amplifier driver SDR34 are turned off, and the MOSFETs NF through NH making up the common I/O pre-charge circuit are all turned on upon receipt of the active level of the pre-charge control signal PC. This causes the common source lines PP and PN to be equalized via the MOSFETs NF through NH to an intermediate potential between the internal voltage VCL land the grounding potential, i.e., to the internal voltage HVC. The unit circuits USA0, etc., of the sense amplifier SAR34 are all deactivated. At this point, in the memory array ARYR34 or ARYR24, the uninverted and inverted signal lines of the sub-bit lines SB0* through SB255* are equalized via the bit line pre-charge circuits of the corresponding unit circuits in the sense amplifier SAR34. That is, the uninverted and inverted signal lines are pre-charged to an intermediate level such as the internal voltage HVC.

On the other hand, when the sense amplifier control signals SAP3 and SAN3 are driven to the active level, the MOSFETs NF through NH making up the common I/O line pre-charge circuit in the sense amplifier driver SDR34 are turned off. Instead, the driving MOSFETs P4 and NE in the sense amplifier driving circuit SAD are turned on. This causes the common source line PP to be fed initially with the driving voltage such as the supply voltage VCC from the driving voltage supply line CPP4 via the driving MOSFET P4. After a predetermined time has elapsed, the common source line PP is fed with the driving voltage (supply voltage) such as the internal voltage VCL. The common source line PN is supplied with the grounding potential (reference voltage) VSS via the driving voltage supply line CPN4. As a result, the unit amplifiers constituting each of the unit circuits in the sense amplifier SAR34 are activated. The activated unit amplifiers each provide a binary read signal (High or Low level) by amplifying a small read signal output via the corresponding sub-bit lines SB0*, etc., from the memory cells connected to the selected sub-word lines of the memory array ARYR34 or ARYR24. In the initial phase of the activation of the sense amplifier SAR34, the common source line PP is fed with the supply voltage VCC for overdrive purposes. This enhances the speed at which the unit amplifiers start up, thereby improving the access time of the dynamic RAM in its read mode.

In the example of FIG. 12, the sense amplifier overdrive scheme is implemented by temporarily setting to the supply voltage VCC the driving voltage fed via the driving voltage supply line CPP4. Alternatively, as shown in FIG. 13(A), a similar overdrive scheme is implemented by furnishing three driving voltage supply lines that are fed constantly with the supply voltage VCC, internal voltage VCL and grounding potential VSS. In the setup of FIG. 13(A), p-channel driving MOSFETs P8 and P9 constituting part of the sense amplifier driving circuit SAD are interposed respectively between the common source line PP and the supply voltage VCC, and between the common source line PP and the internal voltage VCL. Between the common source line PN and the grounding potential VSS is an n-channel MOSFET NE. The gates of the driving MOSFETs P8 and P9 are supplied respectively with sense amplifier control signals SAP31 and SAP32, and the gate of the driving MOSFET NE is fed with the sense amplifier control signal SAN3. With this embodiment, the sense amplifier control signal SAP31 is brought to the active level simultaneously with the sense amplifier control signal SAN3, as illustrated in FIG. 14. After a predetermined time has elapsed, the sense amplifier control signal SAP31 is driven back to the inactive level. Upon elapse of a predetermined time since the sense amplifier control signals SAP31 and SAN3 were driven to the active level, the sense amplifier control signal SAP32 is brought to the active level at the same time that the sense amplifier control signal SAP31 is driven back to the inactive level. As a result, the common source line PP is fed with the supply voltage VCC as its driving voltage for a predetermined period from the time the sense amplifier control signal SAP31 is brought to the active level until the sense amplifier control signal SAP32 is driven to the active level. This implements a sense amplifier overdrive scheme similar to that in FIG. 12.

In the dynamic RAM of this embodiment, the memory cells are refreshed successively through the eight sub-memory mats SMR00 to SMR07 or SMR70 to SMR77 arranged on the same row, one sub-memory mat at a time. In that case, the sense amplifier control signals SAP0 through SAP7 and SAN0 through SAN7 are driven to the active level consecutively as the refresh operation progresses. Illustratively, when the refresh operation, completed on the sub-memory mats SMR30 through SMR37, proceeds to the sub-memory mats SMR40 through SMR47, the sense amplifier control signals SAP3 and SAN3 are driven to the active level for a predetermined period simultaneously with the next sense amplifier control signals SAP4 and SAN4. What takes place here is what is known as the charge-reused refresh operation. In this case, the potential equivalent to the ground VSS or to the driving voltage VCL charging the common source lines PP and PN of the sense amplifiers SAR30 through SAR37 is transmitted to and reused by the common source lines PP and PN of the sense amplifiers SAR30 through SAR37, by way of the driving voltage supply lines CPP0 through CPP7 and CPN0 through CPN7. This leads to appreciable savings in the amount of driving voltage charges to be supplied anew via the driving voltage supply lines CPP0 through CPP7 and CPN0 through CPN7, whereby power dissipation of the dynamic RAM is reduced. In the sense amplifier driver of FIG. 13, n-channel MOSFETs NL and NM may be replaced by a signal transmission circuit equipped with an amplifier function, the signal transmission circuit being interposed between sub-common I/O lines SI0OB and SI0OT on the one hand, and main common I/O lines MIO40B and MIO40T on the other. With this alternative, the speed of signal (i.e., data) transmission may be boosted.

Returning to FIG. 10, the sense amplifier driver SDR34 further comprises a sub-main amplifier SMA and two sub-common I/O line pre-charge circuits. The sub-main amplifier SMA comprises a pair of n-channel driving MOSFETs NP and NQ and a pair of write switching MOSFETs NL and NM. The Two sub-common I/O line pre-charge circuits are composed of three p-channel MOSFETs P5 through P7 in series-parallel connection and n-channel MOSFETs NI through NK also in series-parallel connection. One of the two sub-common I/O line pre-charge circuits has the gates of the MOSFETs NI through NK commonly fed with the inverted internal control signal PCB that is acquired by the inverter V2 inverting the internal control signal PC. The other sub-common I/O line pre-charge circuit has the gates of the MOSFETs P5 through P7 commonly supplied with an internal control signal PCS. In this setup, with the dynamic RAM placed in write mode, the MOSFETs NI through NK are turned on when the internal control signal PC is selectively brought Low (i.e., inverted internal control signal PCB driven High). This equalizes the uninverted and inverted signal lines of the sub-common I/O line SIO0* to the internal voltage HVC. With the dynamic RAM in read mode, the MOSFETs P5 through P7 are selectively turned on when the internal control signal PCS is driven Low. This equalizes the uninverted and inverted signal lines of the sub-common I/O line SIO0* to the internal voltage VCL.

Meanwhile, the drain and source of the write switching MOSFETs NL and NM in the sub-main amplifier SMA are connected respectively to the inverted and the uninverted signal line of the main common I/O line MIO40, and sub-common I/O line SIO0*. The gates of the write switching MOSFETs NL and NM are commonly fed with an internal control signal WE3. The drains of write differential MOSFETs NP and NQ are connected respectively to the uninverted and the inverted signal line of the main common I/O line MIO40* by way of n-channel MOSFETs NN and NO. The commonly connected sources of the read differential MOSFETs NP and NQ are connected to the grounding potential VSS via an n-channel driving MOSFET NR. The gates of the differential MOSFETs NP and NQ are connected respectively to the inverted and the uninverted signal line of the sub-common I/O line SIO0*. The gates of the MOSFETs NN, NO and NR are commonly supplied with an internal control signal RE3. When the dynamic RAM is selected to be in write mode, the internal control signal WE3 is driven High (e.g., internal voltage VCL) selectively in a predetermined timing. With the dynamic RAM selected to be in read mode, the internal control signal RE3 is brought High selectively in a predetermined timing.

In the above setup, the write switching MOSFETs NL and NM in the sub-main amplifier SMA are selectively turned on when the dynamic RAM is selected to be in write mode and when the internal control signal WE3 is driven High. When thus activated, the write switching MOSFETs NL and NM transmit to the sub-common I/O line SIO0* write signals supplied from the main amplifier SAR via the main common I/O line MIO40*. These write signals are written from the sub-common I/O line SIO0* to the selected memory cells in the memory array ARYR34 by way of the corresponding unit circuits of the sense amplifier SAR34.

The read differential MOSFETs NP and NQ in the sub-main amplifier SMA constitute what is known as a pseudo-direct type differential amplifier in combination with the MOSFETs NN, NO and NR turned on when the dynamic RAM is selected to be in write mode and when the internal control signal RE3 is driven High. The pseudo-direct type differential amplifier further amplifies a binary read signal that is read from a selected memory cell in the memory array ARYR34, amplified by the corresponding unit amplifier in the sense amplifier SAR34 and output via the sub-common I/O line SIO0*. The amplified binary read signal is transmitted onto the corresponding main common I/O line MIO40*. As described earlier, the sub-common I/O line SIO0* is shared by two adjacent sub-memory mats SMR34 and SMR35 in the column direction. The wiring length of the sub-common I/O line SIO0* is relatively short and substantially equal to the width of the sub-memory mats in the bit line direction. A differential amplifier centering on the read differential MOSFETs NP and NQ in the sub-main amplifier SMA further amplifies the binary read signal placed by the corresponding unit amplifier of the sense amplifier SAR34 onto the sub-common I/O line SIO0*. The amplified binary read signal is transmitted onto the main common I/O line MIO40* whose wiring length is relatively extended.

The embodiment comprising the arrangements above alleviates the loads on the unit amplifiers of the sense amplifier SAR34 when a column is selected, and allows the read signal from each selected memory cell to be transmitted effectively to the main common I/O line MIO40*, i.e., to the corresponding unit circuit of the main amplifier MAR. This improves the access time of the dynamic RAM in read mode. In this embodiment, a sense amplifier driving circuit SAD34 including the sub-main amplifier SMA is located in the region where the sense amplifiers SAR 34 and others intersect with the sub-word line drivers WDR34 and others, as will be described later. This minimizes any increases in the layout area while improving the access time of the dynamic RAM.

If the main common I/O lines MIO40* and others have a relatively short wiring length or if their load capacitance is negligible, the sub-main amplifier SMA may be constituted only by the switching MOSFETs NL and NM which double for write and read operations.

Figure 15:
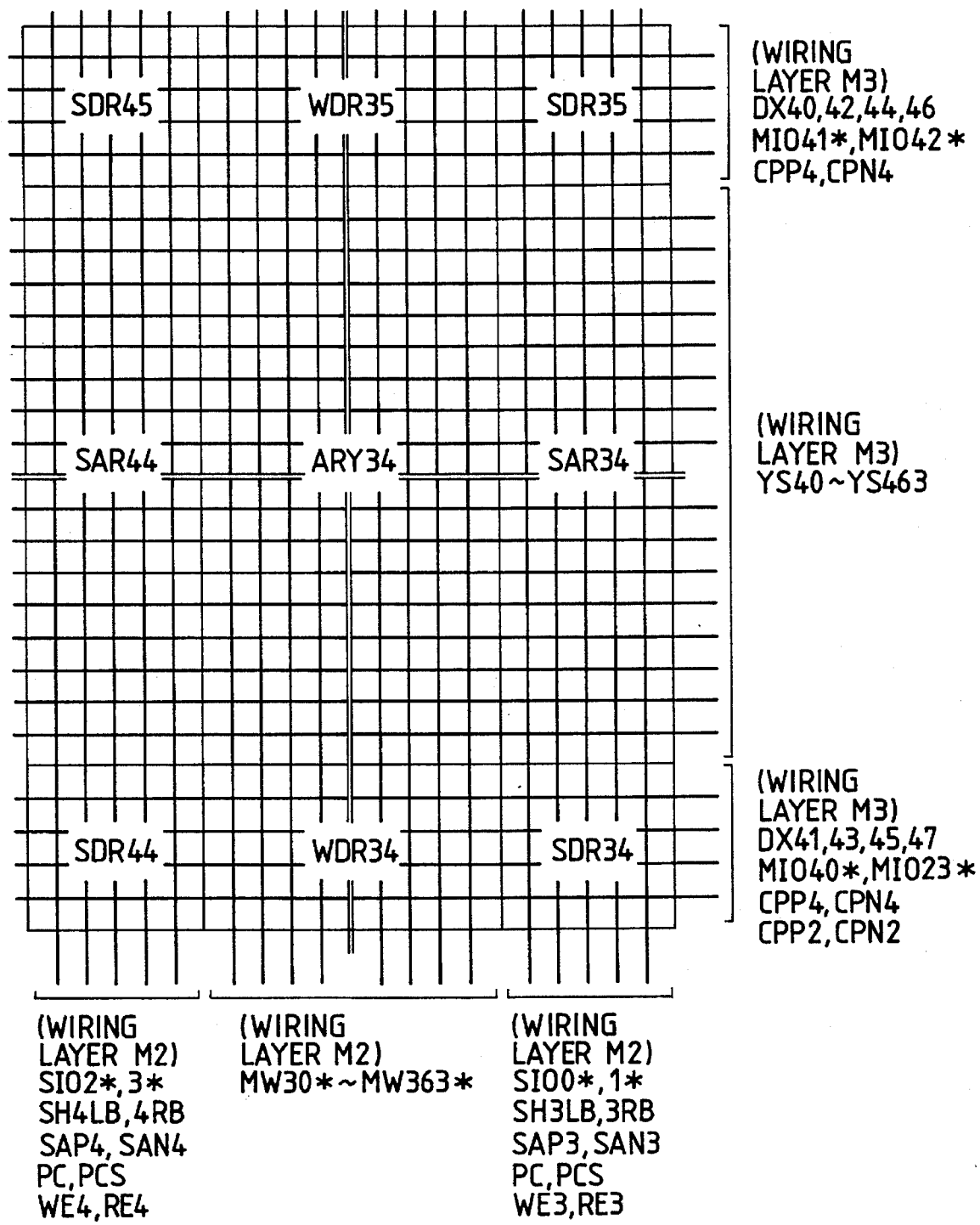
FIG. 15 is a plan view of typical metal wiring layers comprising a memory array and peripherals included in the sub-memory mats of FIG. 4.
Figure 16:
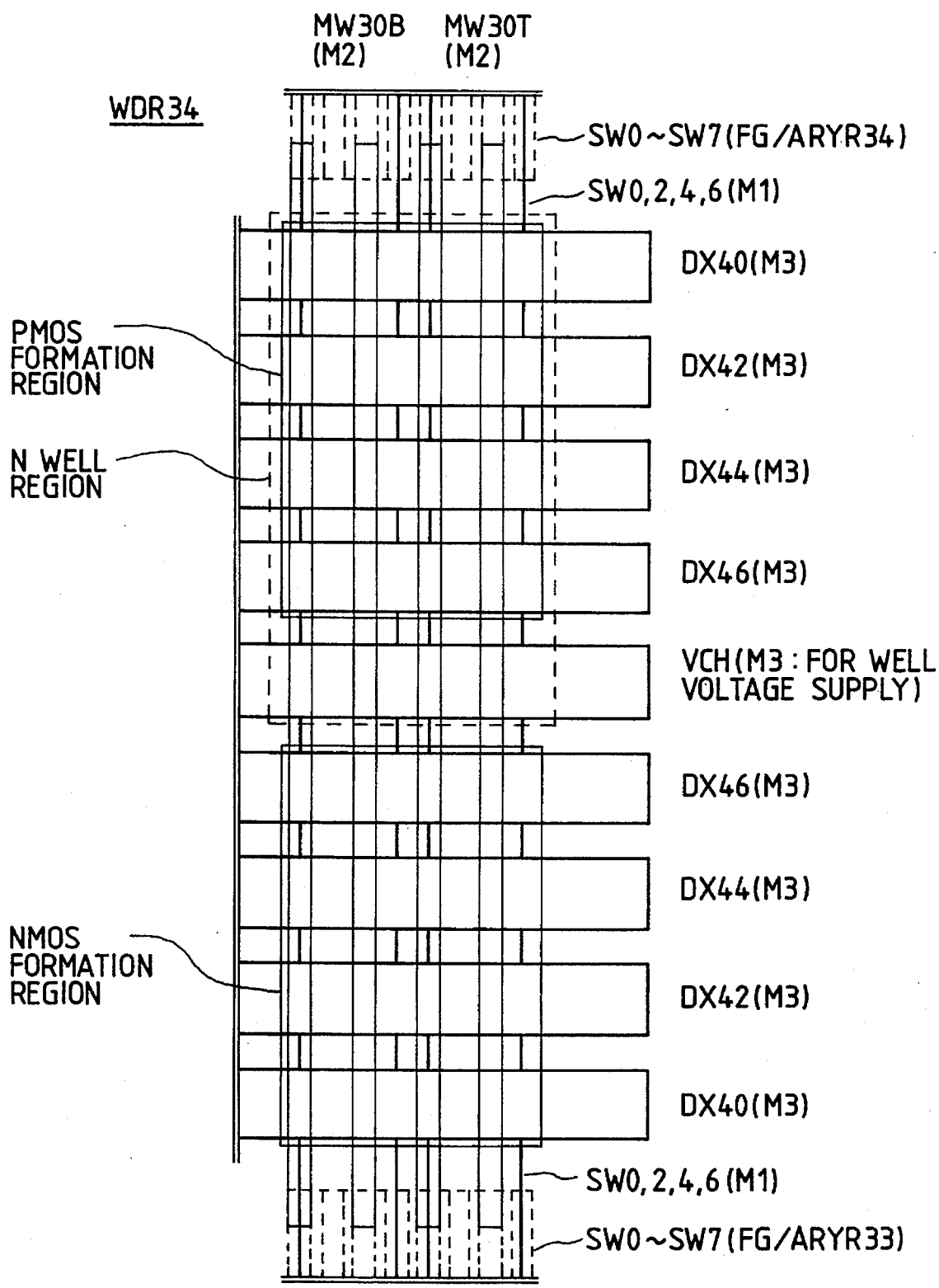
FIG. 16 is a partial plan view of a sub-word line driver included in the sub-memory mats of FIG. 4.
Figure 17:
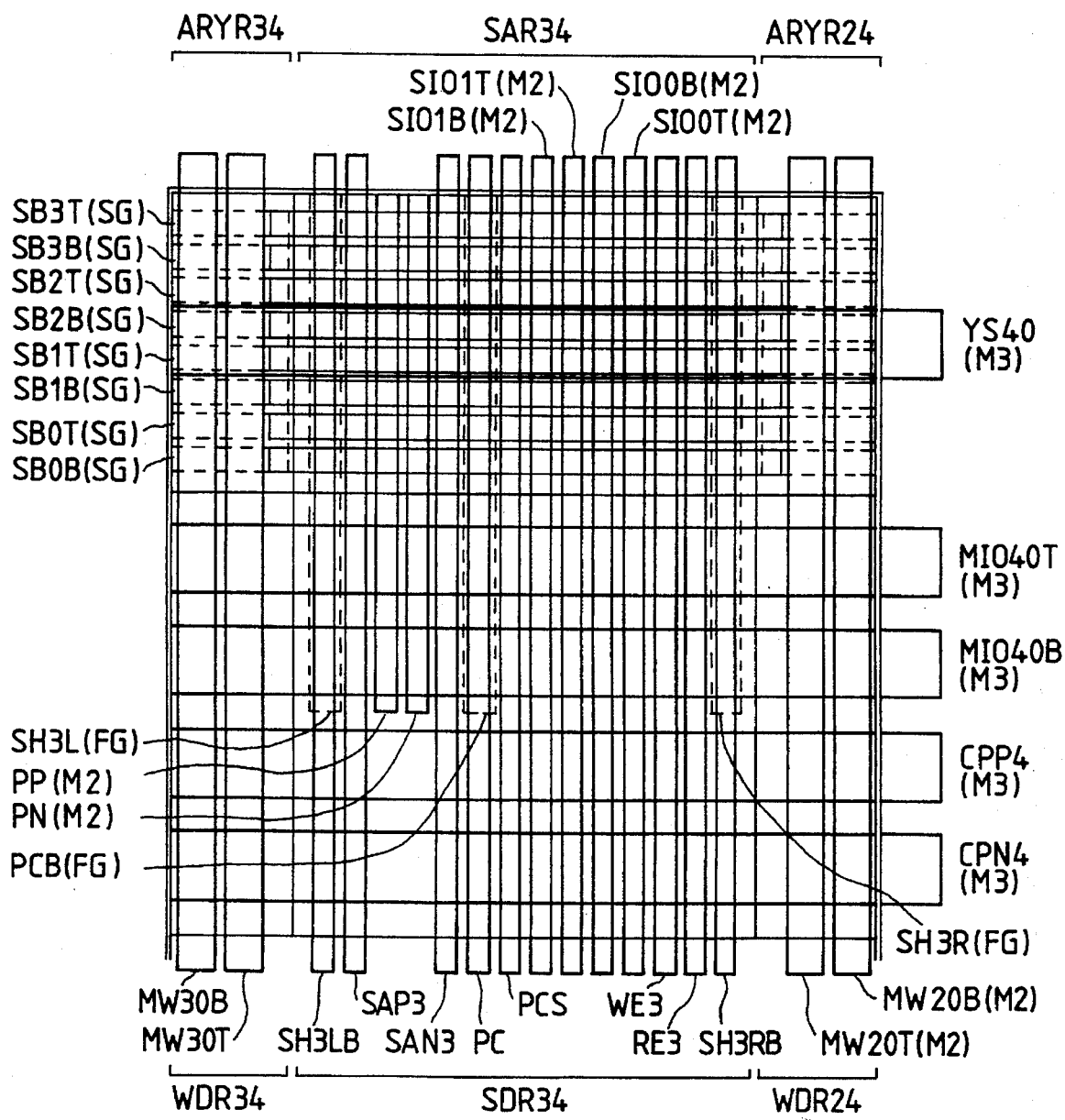
FIG. 17 is a partial plan view of a sense amplifier and a sense amplifier driver included in the sub-memory mats of FIG. 4.

FIG. 15 is a plan view of typical metal wiring layers comprising the memory array ARYR34 of the sub-memory mat SMR34 and the peripherals associated therewith. FIG. 16 is a partial plan view of the sub-word line driver WDR34 included in the sub-memory mat SMR34 of FIG. 4. FIG. 17 is a partial plan view of the sense amplifier SAR34 and sense amplifier driver SDR34. Described below in reference to FIGS. 15 through 17 are the sub-memory mat SMR34 and its peripherals, with emphasis on their features and their plan layout including metal wiring layers. Needless to say, the ensuing description regarding the metal wiring layers also applies to the sub-memory mats other than the mat SMR34 described herein.

In FIG. 15, the dynamic RAM of this embodiment has three metal wiring layers M1 through M3 composed of aluminum and the like. The third or the highest metal wiring layer M3 serves to form: the bit line selection signals YS40 through YS463, etc., arranged primarily in the horizontal direction of the view, i.e., in parallel with the sub-bit lines and spanning a plurality of sub-memory mats; sub-word line driving signals DX40 through DX47, etc.; main common I/O lines MIO40* through MIO43*, etc.; and driving voltage supply lines CPP2, CPN2, CPP4, CPN4, etc. The second metal wiring layer M2 constitutes: the main word lines MW30* through MW363*, etc., arranged primarily in the vertical direction of the view, i.e., in parallel with the sub-word lines and spanning a plurality of sub-memory mats; sub-common I/O lines SIO0* through SIO3*, etc.; inverted shared control signal lines SH3LB through SH4LB and SH3RB through SH4RB, etc.; sense amplifier driving signal lines SAP3 through SAP4 and SAN3 through SAN4, etc.; and internal control signal lines PC, PCS, WE3 through WE4, RE3 through RE4, etc. The first or the lowest metal wiring layer M1 makes up the wiring between circuit elements such as MOSFETs.

In this embodiment, as illustrated in FIG. 16, the main word lines MW30*, etc., (i.e., the uninverted main word line MW30T and inverted main word line MW30B, etc.) made up of the second metal wiring layer M2 have a spacious pitch eight times as wide as the pitch of the sub-word lines SW0 through SW7, etc., of the memory array ARYR34 composed of a first gate layer FG. The sub-word line driving signal lines DX40, DX42, DX44 and DX46 are made of the third metal wiring layer M3 and branch into two parts each on the right-hand side of the view, not shown. The branched lines from one part of each of the sub-word line driving signal lines extend parallelly over the region forming the p-channel MOSFETs constituting the sub-word line driver WDR34. The branched lines from the other part of each of the sub-word line driving signal lines extend parallelly over the region including the n-channel MOSFETs making up the sub-word line driver WDR34. Between the sub-word line driving signal lines is the wiring for supplying the substrate potential, i.e., the internal voltage VCH to an n-well region where p-channel MOSFETs are formed. The supply wiring is constituted likewise by the third metal wiring layer M3. Under the supply wiring is the wiring, made up of the first metal wiring layer M1, for interconnecting even-numbered sub-word lines SW0, SW2, SW4, SW6, etc., of the adjacent memory arrays ARYR34 and ARYR33.

As shown in FIG. 17, the bit line selection signals YS40, etc., composed of the third metal wiring layer M3 have a spacious pitch four times that of the sub-bit lines SB0* through SB3* of the memory array ARYR34 formed by a second gate layer SG (i.e., uninverted sub-bit lines SB0T through SB3T and inverted sub-bit lines SB0B through SB3B, etc.). This means that the pitch of the bit line selection signals is substantially eight times as wide as that of the sub-bit lines. The main common I/O lines MIO40*, etc., made up of the third metal wiring layer M3 (i.e., uninverted main common I/O lines MIO40T and MIO40B and driving voltage supply lines CPP4 and CPN4, etc.) are located over the region in which the sub-word line drivers WDR24 and WDR34 as well as the sense amplifier drivers SDR34, etc., are provided. In the second metal wiring layer, the sub-common I/O lines SIO0* and SIO1* (i.e., uninverted sub-common I/O lines SIO0T and SIO1T, inverted sub-common I/O lines SIO0B and SIO1B, etc.); inverted shared control signal lines SH3LB and SH3RB through SH4RB, etc.; sense amplifier driving signal lines SAP3 and SAN3, etc.; and internal control signal lines PC, PCS, WE3 and RE3, etc., are located on the region where the sense amplifier SAR34 and sense amplifier drivers SDR34, etc., are furnished. With the above arrangements in place, the three metal wiring layers are used efficiently to form the signal lines for transmitting signals across a plurality of sub-memory mats. This enhances the efficiency in laying out the sub-memory mats and hence the dynamic RAM as a whole.

In the dynamic RAM of this embodiment, as described, a spacious layout pitch is afforded to the main word lines MW30* through MW363*, etc., and to the bit line selection signals YS40 through YS463, etc., which are composed of the second or third metal wiring layer M2 or M3 and closely associated with memory arrays of a high degree of circuit integration. Thus these metal wiring layers are patterned without recourse to the so-called phase shift mask. This contributes to reducing the fabrication cost of the dynamic RAM.

Figure 18:
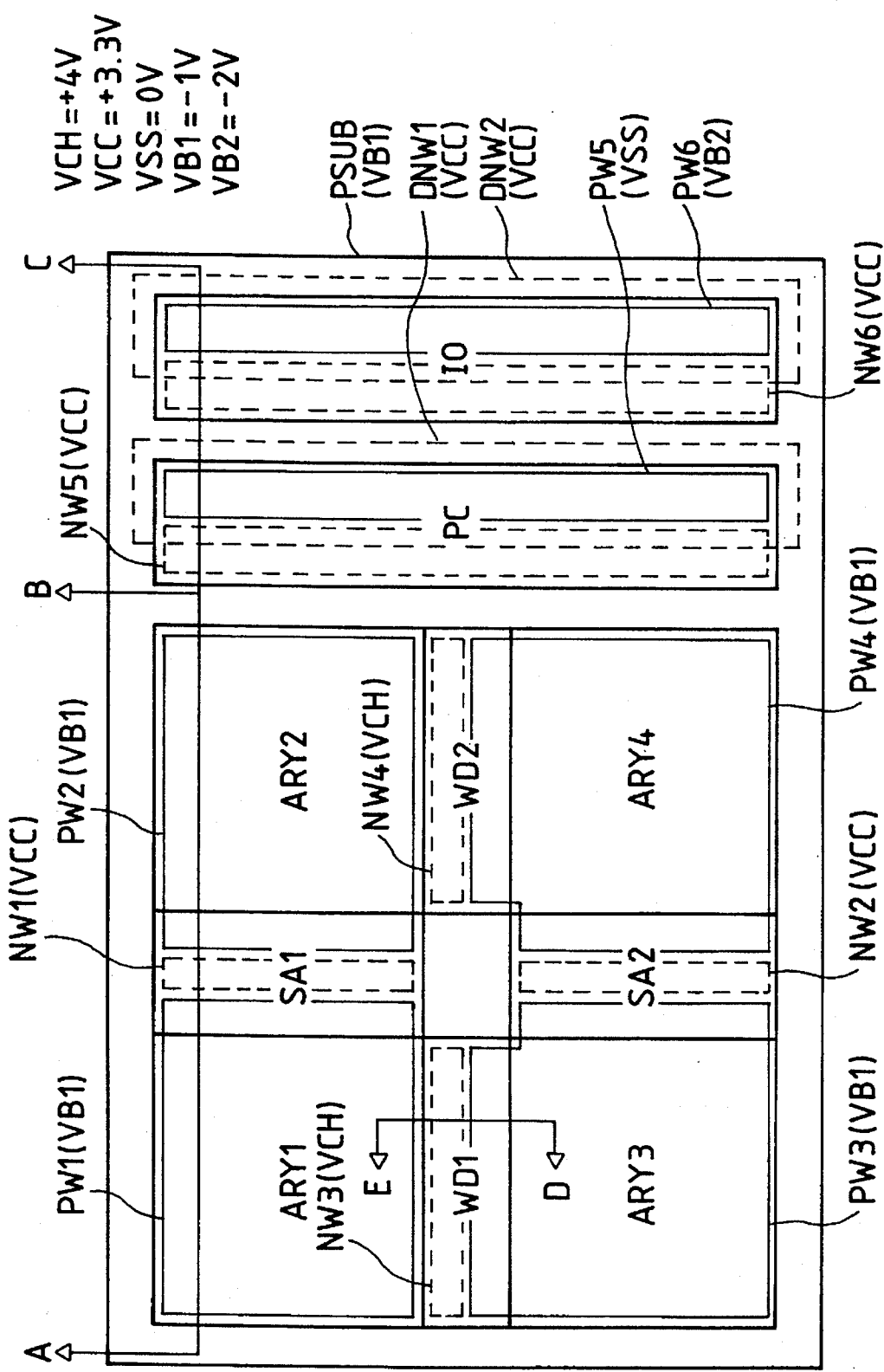
FIG. 18 is a symbolic plan view of a first example of memory arrays and peripherals constituting each sub-memory mat in the dynamic RAM of FIG. 1.
Figure 19:
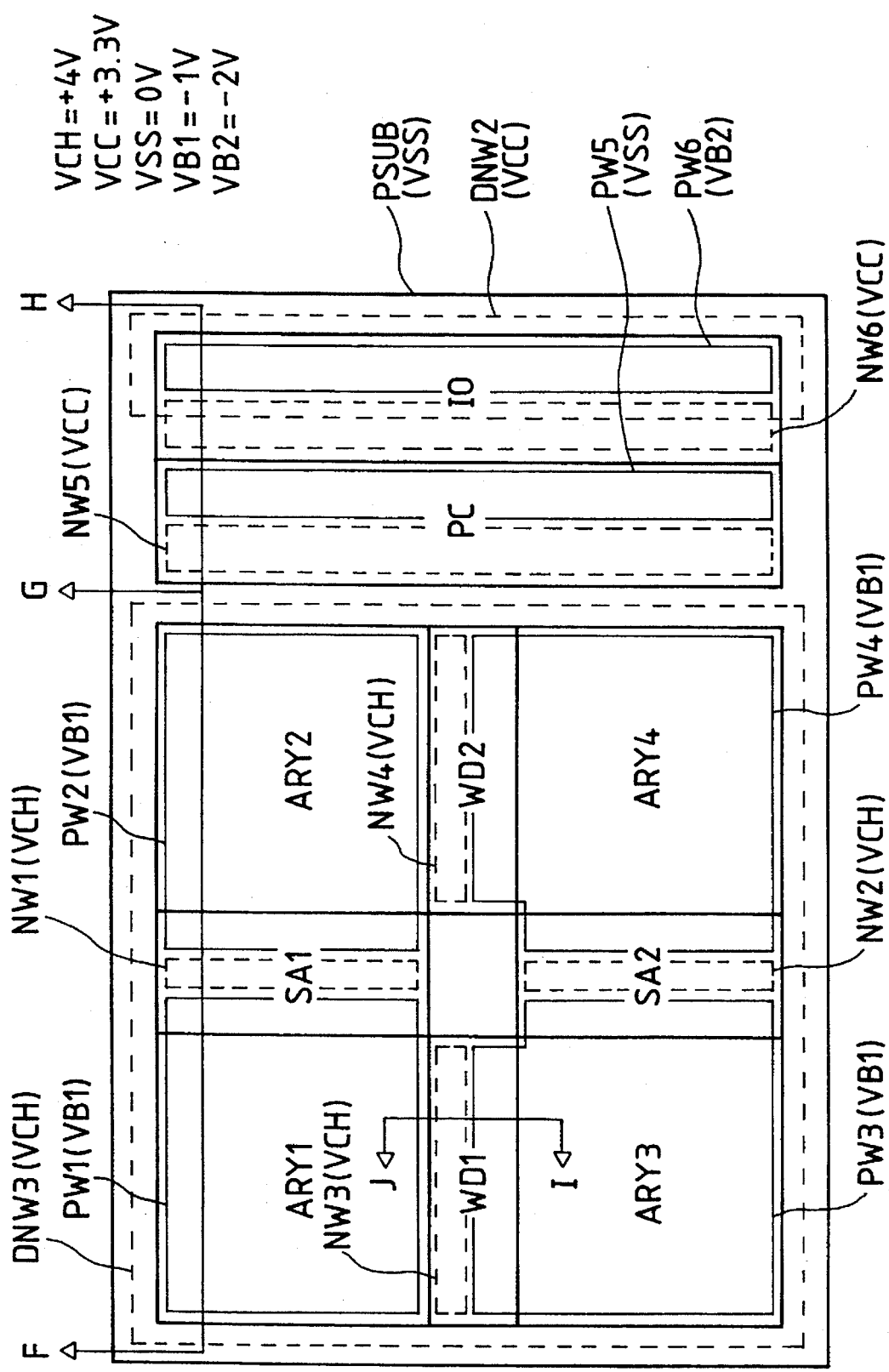
FIG. 19 is a symbolic plan view of a second example of memory arrays and peripherals constituting each sub-memory mat in the dynamic RAM of FIG. 1.
Figure 20:
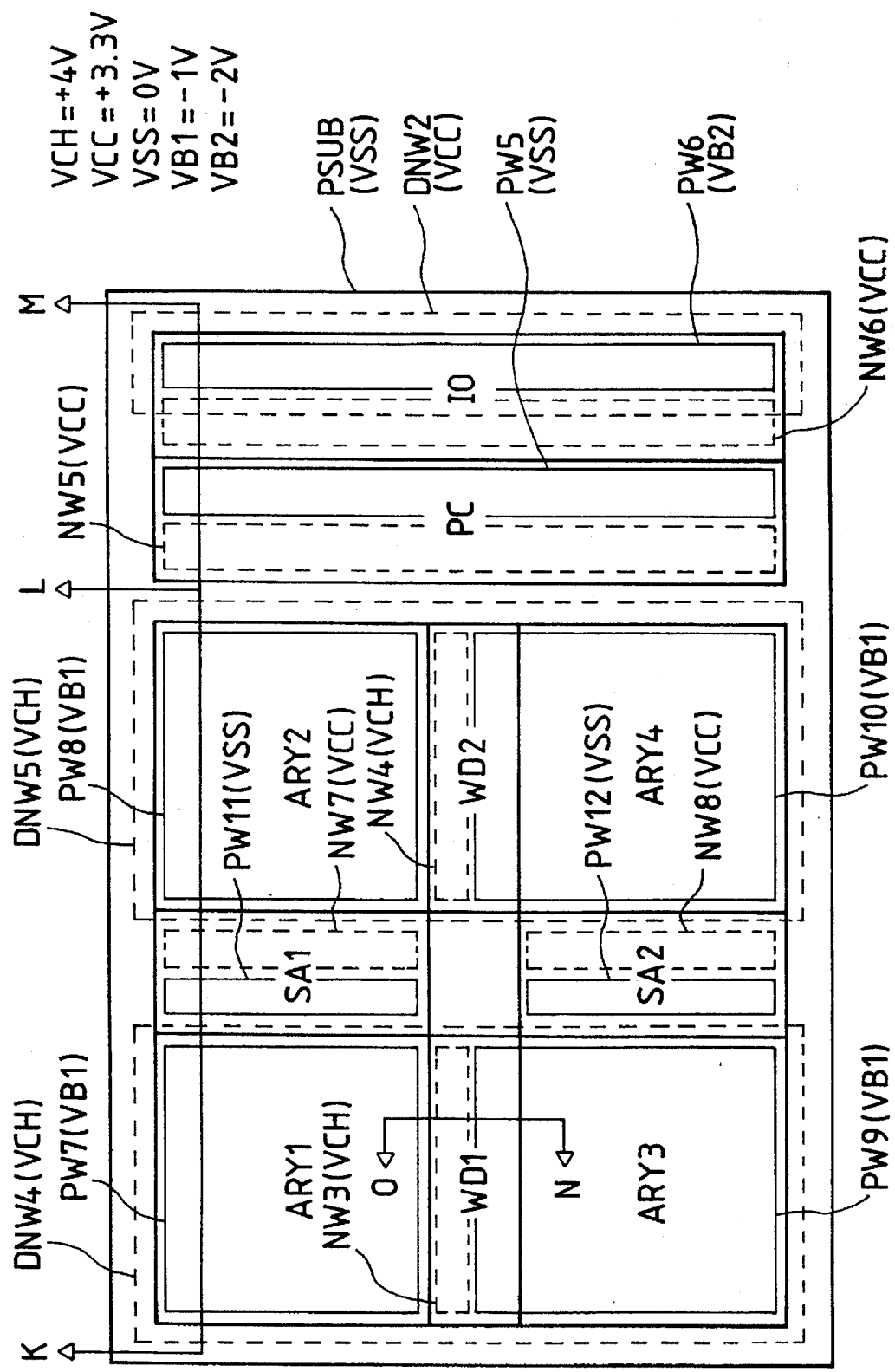
FIG. 20 is a symbolic plan view of a third example of memory arrays and peripherals constituting each sub-memory mat in the dynamic RAM of FIG. 1.
Figure 21A:
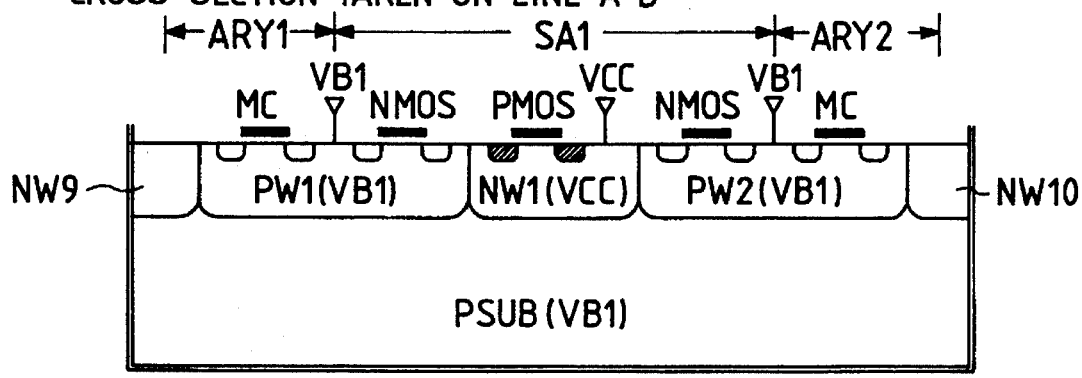
FIGS. 21(A), 21(B) and 21(C) are cross-sectional views of the memory arrays and peripherals in FIG. 18.
Figure 21B:
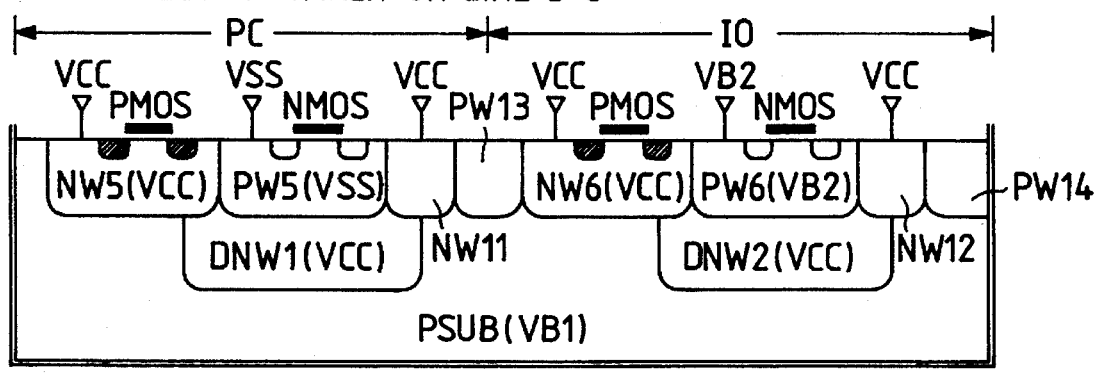
Figure 21C:
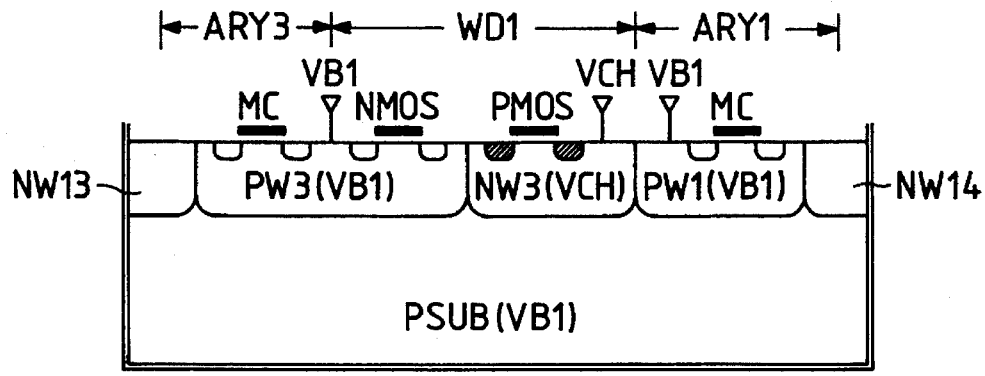
Figure 22A:
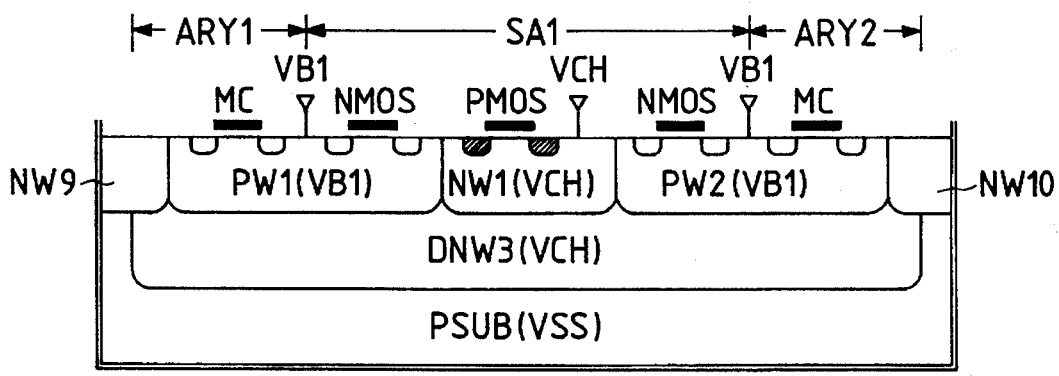
FIGS. 22(A), 22(B) and 22(C) are cross-sectional views of the memory arrays and peripherals in FIG. 19.
Figure 22B:
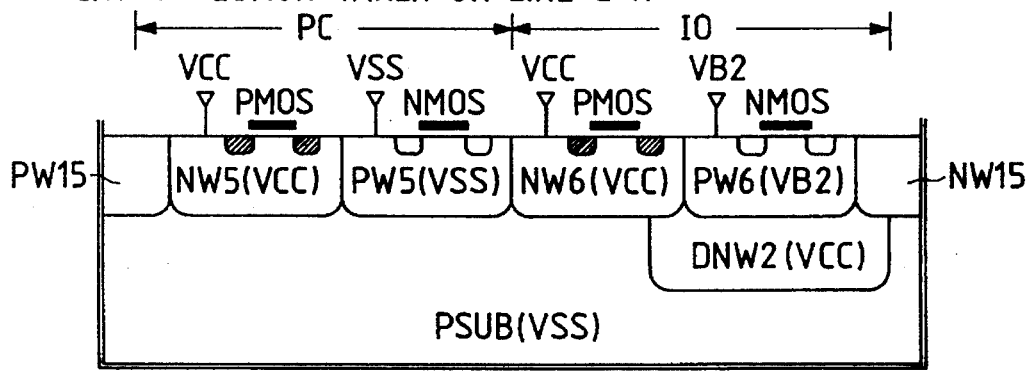
Figure 22C:
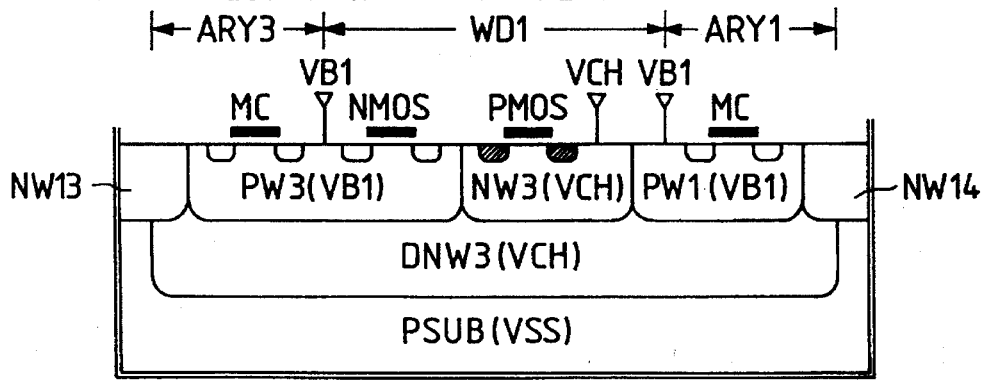
Figure 23A:
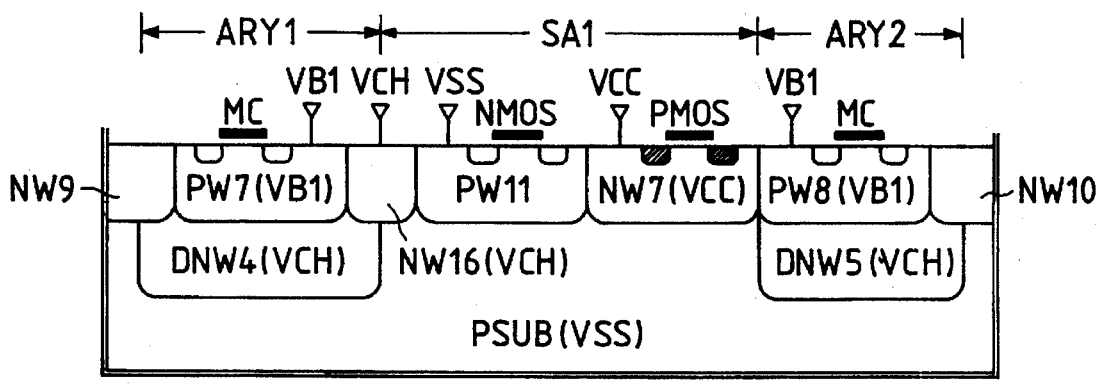
FIGS. 23(A), 23(B) and 23(C) are cross-sectional views of the memory arrays and peripherals in FIG. 20.
Figure 23B:
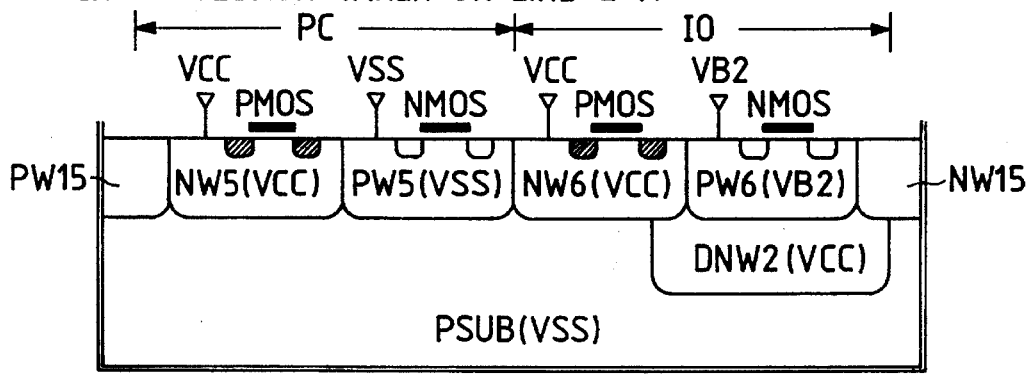
Figure 23C:
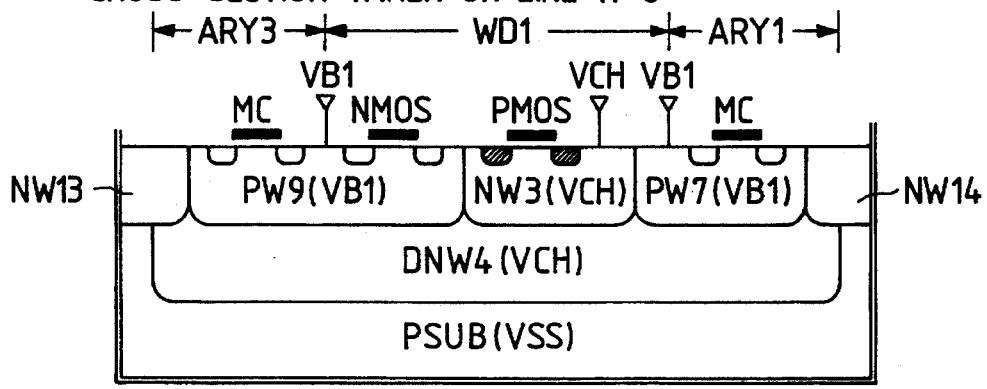

FIG. 18 is a plan view of a first example of the memory arrays and peripherals constituting each sub-memory mat in the dynamic RAM of FIG. 1. FIGS. 21(A), 21(B) and 21(C) are cross-sectional views of the memory arrays and peripherals in FIG. 18. FIG. 19 is a plan view of a second example of the memory arrays and peripherals constituting each sub-memory mat in the dynamic RAM of FIG. 1. FIGS. 22(A), 22(B) and 22(C) are cross-sectional views of the memory arrays and peripherals in FIG. 19. FIG. 20 is a plan view of a third example of the memory arrays and peripherals constituting each sub-memory mat in the dynamic RAM of FIG. 1. FIGS. 23(A), 23(B) and 23(C) are cross-sectional views of the memory arrays and peripherals in FIG. 20. Outlined below in reference to FIGS. 18 through 23(C) are the well structure, substrate voltages and other features of the dynamic RAM embodied as shown. Departing from the preceding examples of the substrate layout for the dynamic RAM, the examples that follow are symbolically represented with a view to facilitating the understanding of the well structure and substrate voltages regarding the dynamic RAM embodied herein. The first example in FIGS. 18 and 21 will be described first in detail. The second example in FIGS. 19 and 22 and the third example in FIGS. 20 and 23 will be explained only for their differences from the first example.

In FIGS. 18 and 21, the dynamic RAM is mounted on a p-type semiconductor substrate PSUB supplied with the internal voltage VB1 which is a negative potential of a relatively small absolute value (e.g., −1 V). The memory cells MC constituting the memory array ARY1, i.e., n-channel MOSFETs acting as address selecting MOSFETs, are formed on the semiconductor substrate PSUB in a p-well region PW1 encroaching on the region where the corresponding sense amplifier SA1 is furnished. The memory cells MC constituting the memory array ARY2 paired with ARY1, i.e., n-channel MOSFETs acting as address selecting MOSFETs, are also formed on the semiconductor substrate PSUB in a p-well region PW2 encroaching on the region where the corresponding sense amplifier SA1 is provided. The p-well regions PW1 and PW2 are fed with the internal voltage VB1 as the substrate voltage. The internal voltage VB1 serves as the substrate voltage of the semiconductor substrate PSUB.

Likewise, the memory cells MC constituting the memory array ARY3, i.e., n-channel MOSFETs acting as address selecting MOSFETs, are formed on the semiconductor substrate PSUB in a p-well region PW3 encroaching on the region where the corresponding sense amplifier SA2 and sub-word line driver WD1 are furnished. The memory cells MC constituting the memory array ARY4 paired with ARY3, i.e., n-channel MOSFETs acting as address selecting MOSFETs, are also formed on the semiconductor substrate PSUB in a p-well region PW4 encroaching on the region where the sense amplifier SA2 and sub-word line driver WD2 are provided. The p-well regions PW3 and PW4 are fed with the internal voltage VB1 as the substrate voltage.

The rightmost portion of the p-well regions PW1 and PW3 and the leftmost portion of the p-well regions PW2 and PW4 each comprise n-channel MOSFETs (NMOSs) making up part of the sense amplifier SA1 or SA2. N-well regions NW1 and NW2 having the supply voltage VCC as their substrate voltage are interposed respectively between the p-well regions PW1 and PW2, and between the p-well regions PW3 and PW4. Each of the n-well regions comprises p-channel MOSFETs (PMOSs) constituting part of the sense amplifier SA1 or SA2. Outside the p-well regions PW1 and PW3 is an n-well region NW9 for cut-off purposes. Another cut-off n-well region NW10 is furnished outside the p-well regions PW2 and PW4.

Likewise, above the p-well region PW3 are n-channel MOSFETs constituting part of the sub-word line driver WD1; above the p-well region PW4 are n-channel MOSFETs constituting part of the sub-word line driver WD2. Between the p-well regions PW1 and PW3 is an n-well region NW3, and between the p-well regions PW2 and PW4 is an n-well region NW4, the two n-well regions NW3 and NW4 having the internal voltage VCH as their substrate voltage. Within these n-well regions are p-channel MOSFETs constituting part of the sub-word line driver WD1 or WD2. Outside the p-well regions PW1 and PW2 is a cut-off n-well region NW13, and outside the p-well regions PW3 and PW4 is an n-well region NW14.

Meanwhile, the p-channel MOSFETs making up part of the peripheral circuit PC are formed in an n-well region NW5 furnished on the semiconductor substrate PSUB. The n-channel MOSFETs constituting part of the peripheral circuit PC are formed in a p-well region PW5 provided in a relatively deep n-well region DNW1. Outside the p-well region PW5 to the right is a cut-off n-well region NW11. The relatively deep n-well region DNW1 is fed with the supply voltage VCC that serves as the substrate voltage sent by way of the n-well region NW11 and n-well region NW5. The p-well region PW5 is fed with the grounding potential VSS as the substrate voltage.

The p-channel MOSFETs constituting part of the data I/O circuit IO are formed in an n-well region NW6 furnished on the semiconductor substrate PSUB. The n-channel MOSFETs making up part of the data I/O circuit IO are formed in a p-well region PW6 provided within a relatively deep n-well region DNW2. Outside the n-well region NW6 to the left is a cut-off p-well region PW13, and outside the p-well region PW6 to the right is a cut-off n-well region NW12. The deep n-well region DNW2 is fed with the supply voltage VCC that serves as the substrate voltage sent by way of the n-well region NW12 and n-well region NW6. The p-well region PW6 is fed, as its substrate voltage, with the internal voltage VB2 which is a negative potential of a relatively large absolute value (e.g., −2 V).

As described above, the dynamic RAM of this embodiment is in the so-called triple well structure. The n-channel MOSFETs serving as the memory cells MC of the memory arrays ARY1 through ARY4, and the n-channel MOSFETs making up part of the sense amplifiers SA1 through SA2 as well as the sub-word line drivers WD2 and WD2, are formed in the same p-well region. Because there is no need for cut-off regions to be interposed between the well regions, the chip size of the dynamic RAM is reduced. The supply voltage VCC is used illustratively as the substrate voltage for the n-well regions NW1 and NW2 in which there are formed the p-channel MOSFETs for driving common source lines in the sense amplifiers SA1 through SA2. This arrangement removes the possibility of a latch-up hazard when power is applied, as will be explained later. Although the so-called substrate effect is small regarding the p-channel MOSFETs in the sense amplifiers, the potential difference is 1 V between the grounding potential serving as the source potential and the internal voltage VB1 acting as the substrate voltage regarding the n-channel MOSFETs in the sense amplifiers. This increases the threshold voltage and thereby affects the sense amplifier operation. Since the p-well regions PW1 through PW4 in which the memory arrays ARY1 through ARY4 are provided are formed directly on the semiconductor substrate PSUB, operations of the data I/O circuit I/O entail fluctuations in the substrate voltage of the semiconductor substrate PSUB, generating noise that may propagate to the memory cells. With no cut-off regions furnished between the memory arrays ARY1 through ARY4 and the sense amplifiers SA1 through SA2, operations of the sense amplifiers SA1 through SA2 generate nose that may also propagate to the memory cells.

With respect to the second example shown in FIGS. 19 and 22, the dynamic RAM is mounted on a p-type semiconductor substrate PSUB supplied with the grounding potential VSS. The memory cells MC constituting the memory array ARY1, i.e., n-channel MOSFETs acting as address selecting MOSFETs, are formed in a relatively deep n-well region DNW3 fed with the internal voltage VCH (i.e., word line selection potential) and in the p-well region PW1 encroaching on the region where the corresponding sense amplifier SA1 is furnished. The memory cells MC constituting the memory array ARY2 paired with ARY1, i.e., n-channel MOSFETs acting as address selecting MOSFETs, are also formed in the deep n-well region DNW3 and in the p-well region PW2 encroaching on the region where the corresponding sense amplifier SA1 is provided. The p-well regions PW1 and PW2 are fed with a negative potential of a relatively small absolute value, i.e., the internal voltage VB1 given as the substrate voltage.

Likewise, the memory cells MC constituting the memory array ARY3, i.e., n-channel MOSFETs acting as address selecting MOSFETs, are formed in the deep n-well region DNW3 and in the p-well region PW3 encroaching on the region where the corresponding sense amplifier SA2 and sub-word line driver WD1 are furnished. The memory cells MC constituting the memory array ARY4 paired with ARY3, i.e., n-channel MOSFETs acting as address selecting MOSFETs, are also formed in the deep n-well region DNW3 and in the p-well region PW4 encroaching on the region where the sense amplifier SA2 and sub-word line driver WD2 are provided. The p-well regions PW3 and PW4 are fed with the internal voltage VB1 of −1 V as the substrate voltage.

The rightmost portion of the p-well regions PW1 and PW3 and the leftmost portion of the p-well regions PW2 and PW4 each comprise n-channel MOSFETs making up part of the sense amplifier SA1 or SA2. N-well regions NW1 and NW2 are interposed respectively between the p-well regions PW1 and PW2, and between the p-well regions PW3 and PW4. Each of the n-well regions comprises p-channel MOSFETs constituting part of the sense amplifier SA1 or SA2. The n-well regions NW1 and NW2 are fed with the internal voltage VCH of +4 V as their substrate voltage. The internal voltage VCH also serves as the substrate voltage for the deep n-well region DNW3.

Likewise, above the p-well region PW3 are n-channel MOSFETs constituting part of the sub-word line driver WD1; above the p-well region PW4 are n-channel MOSFETs constituting part of the sub-word line driver WD2. Between the p-well regions PW1 and PW3 is the n-well region NW3, and between the p-well regions PW2 and PW4 is the n-well region NW4, the two n-well regions NW3 and NW4 having the internal voltage VCH as their substrate voltage. Within these n-well regions are p-channel MOSFETs constituting part of the sub-word line driver WD1 or WD2.

Meanwhile, the p-channel MOSFETs making up part of the peripheral circuit PC are formed in the n-well region NW5 furnished on the semiconductor substrate PSUB. The n-channel MOSFETs constituting part of the peripheral circuit PC are formed in the p-well region PW5 provided also on the semiconductor substrate PSUB. The n-well region NW5 is fed with the supply voltage VCC as the substrate voltage. The p-well region PW5 is fed with the grounding potential VSS as the substrate voltage. The grounding potential VSS also serves as the substrate voltage for the semiconductor substrate PSUB.

With the dynamic RAM of this embodiment, as described above, the n-channel MOSFETs serving as the memory cells MC of the memory arrays ARY1 through ARY4, and the n-channel MOSFETs making up part of the sense amplifiers SA1 through SA2 as well as the sub-word line drivers WD1 and WD2, are formed in the same p-well region. Because there is no need for cut-off regions to be interposed between the well regions, the chip size of the dynamic RAM is reduced. Because the p-well regions PW1 through PW4 and n-well regions NW1 through NW4 in which the above circuits are formed are furnished in the relatively deep n-well region DNW3, it is possible to prevent fluctuations in the substrate voltage of the semiconductor substrate PSUB from being propagated as noise to the memory cells of the memory arrays ARY1 through ARY4. However, the supply voltage VCC is used as the substrate voltage for the n-well regions NW1 and NW2 in which there are formed the p-channel MOSFETs constituting part of the sense amplifiers SA1 through SA2. This means that when power is applied with the internal voltage VCH lower than the supply voltage VCC, the source diffusion layer of the p-channel MOSFETs receiving illustratively the supply voltage VCC through their sources can release currents into the n-well regions, resulting in a latch-up state if the worst comes to the worst. In addition, the n-well regions NW1 and NW2 use the internal voltage VCH as their substrate voltage, while the p-well regions PW1 through PW4 in which the n-channel MOSFETs are formed use the internal voltage VB1 as their substrate voltage. This increases the so-called substrate effect regarding the p-channel and n-channel MOSFETs, raising the threshold voltage and affecting the sense amplifier operation. With no cut-off regions furnished between the memory arrays ARY1 through ARY4 and the sense amplifiers SA1 through SA2, activating the sense amplifiers SA1 through SA2 as a whole generates nose propagating to the memory cells.

Lastly, the third example in FIGS. 20 and 23 is basically similar to the second example. The major difference is that in the third example, the n-channel MOSFETs constituting part of the sense amplifiers SA1 and SA2 are formed in p-well regions PW11 and PW12 provided independently on the semiconductor substrate PSUB. The p-well regions PW11 and PW12 are fed with the grounding potential VSS as the substrate voltage. An n-well region NW16 is furnished as a cut-off region between the p-well regions PW11 and PW12 on the one hand, and a p-well region PW7 on the other in which the memory arrays ARY1 and ARY3 are formed.

Furnished with the cut-off regions, the third example may be slightly increased in chip size but offsets the apparent disadvantage by benefits including and exceeding those of the second example. In particular, the third example eliminates the substrate effect on the p-channel and n-channel MOSFETs making up the sense amplifiers SA1 and SA2, whereby the operation speed of these sense amplifiers is enhanced. In the third example, the noise derived from the operation of the sense amplifiers is prevented from propagating to the memory cells. Furthermore, the possibility of a latch-up hazard is eliminated.

The above-described embodiments of the invention offer the following major advantages:

(1) The semiconductor memory of the invention such as a dynamic RAM has a memory mat divided into a plurality of units or sub-memory mats. Each sub-memory mat comprises: a memory array having sub-word lines and sub-bit lines intersecting orthogonally and dynamic memory cells located in lattice fashion at the intersection points between the intersecting sub-word and sub-bit lines; a sub-word line driver including unit sub-word line driving circuits corresponding to the sub-word lines; a sense amplifier including unit amplifier circuits and column selection switches corresponding to the sub-bit lines; and sub-common I/O lines to which designated sub-bit lines are connected selectively via the column selection switches. The sub-memory mats are arranged in lattice fashion. Above the sub-memory mats is a layer of main word lines and column selection signal lines intersecting orthogonally, and of main common I/O lines to which designated sub-common I/O lines are connected selectively. A comprehensive layered structure encompasses all of the word lines, bit lines and common I/O lines. This allows the dynamic RAM to offer full benefits of the layered structure.

(2) In the constitution outlined in (1) above, the unit sub-word line driving circuits are furnished alternately on both sides of the sub-word lines., with the unit sub-word line driving circuits having a pitch twice that of the sub-word lines. The unit sub-word line driving circuits are shared by two adjacent sub-memory mats in the column direction, and the unit amplifiers and column selection switches are shared by two adjacent sub-memory mats in the row direction. This arrangement eases the layout pitches of the unit sub-word line driving circuits, unit amplifiers and column selection switches while reducing the chip size of the dynamic RAM.

(3) In the constitution outlined in (1) and (2) above, the main word lines have a pitch that is an integer multiple of the pitch of the sub-word lines, and the column selection signal lines have a pitch that is an integer multiple of the pitch of the sub-bit lines. This arrangement eases the layout pitch of these signal lines.

(4) In the constitution outlined in (1) through (3) above, each of the unit sub-word line driving circuits in the sub-word line driver is a CMOS static driving circuit comprising: a p-channel first MOSFET which is furnished interposingly between the sub-word line driving signal line and the corresponding sub-word line and of which the gate is connected to an inverted signal line of the corresponding main word line; an n-channel second MOSFET which is furnished interposingly between the sub-word line and a grounding potential and of which the gate is connected to an inverted signal line of the corresponding main word line; and an n-channel third MOSFET which is furnished in parallel with the first MOSFET and of which the gate is connected to an uninverted signal line of the corresponding main word line. The CMOS static driving circuit boosts the speed of sub-word line selecting operations, whereby the access time of the dynamic RAM is improved.

(5) In the constitution outlined in (1) through (4) above, the sub-main amplifiers for selectively connecting the designated sub-common I/O. lines to the main common I/O lines are each a pseudo-direct sense type sub-amplifier comprising: a read differential MOSFET of which the gate is connected to the uninverted and inverted signal lines of the corresponding sub-common I/O line and of which the drain is connected to the inverted and uninverted signal lines of the corresponding main common I/O line; and a write switching MOSFET furnished interposingly between the uninverted signal lines as well as between the inverted signal lines of the sub-common and main common I/O lines. The sub-main amplifiers are located in the region where the sub-word line driver and the sense amplifier intersect. This arrangement boosts the speed of read operations of the dynamic RAM without increasing the layout area of the memory arrays.

(6) In the constitution outlined in (1) through (5) above, the main common I/O lines are furnished over the region in which the sub-word line drivers are provided, the main common I/O lines intersecting orthogonally with the sub-common I/O lines. This allows the main common I/O lines to be connected effectively to the main amplifiers located in the middle of the semiconductor substrate.

(7) In the constitution outlined in (1) through (6) above, the sense amplifier drivers for selectively supplying the unit amplifiers of the sense amplifier with the operating power coming from driving voltage supply lines are located in the region where the sub-word line drivers intersect with the sense amplifier. This setup effectively arranges the sense amplifier drivers and the related signal lines so as to reduce the chip size of the dynamic RAM.

(8) In the constitution outlined in (7) above, the unit amplifiers of the sense amplifier are driven by use of the overdrive scheme. The scheme enhances the speed at which the unit amplifiers start up, thereby improving the speed of read operations of the dynamic RAM.

(9) In the constitution outlined in (7) and (8) above, the charge-reused refresh method is used whereby the operating power transmitted to the driving signal lines of one sense amplifier is forwarded via appropriate switching means to the driving signal lines of the next sense amplifier to be operated. The method reduces the operating current for the refresh operation of the dynamic RAM, whereby the power dissipation of the dynamic RAM is lowered.

(10) In the constitution outlined in (1) through (9), the dynamic RAM includes main bit lines which are shared by a predetermined number of sub-memory mats arranged contiguously in the row direction and to which the sub-bit lines of the designated sub-memory mat are selectively connected. These main bit lines are arranged to correspond with the unit amplifiers of sense amplifiers and the column selection switches. The arrangement reduces the necessary numbers of the unit amplifiers and the column selection switches. In turn, the dynamic RAM is reduced in chip size, and the fabrication cost of the RAM is lowered.

(11) In the constitution outlined in (1) through (10) above, a predetermined number of sub-memory mats in the row and column directions are set aside as redundant sub-memory mats. This makes it possible to remedy faults in units of the sub-memory mat in an efficient manner.

(12) In the constitution outlined (1) through (11) above, the sense amplifier control signal lines for selectively connecting the driving signal lines to the driving voltage supply lines are located in a layer above the region where the sense amplifiers are provided. The sub-word line driving signal lines, main common I/O lines and driving voltage supply lines are furnished in a layer above the region where the sub-word line drivers are formed. In this setup, the signal lines are efficiently laid out and the chip size of the memory is reduced accordingly.

(13) In the constitution outlined in (1) through (12) above, the main word lines, driving signal lines and sense amplifier control signal lines are formed by the second metal wiring layer; the column selection signal lines, sub-word line driving signal lines, main common I/O lines and driving voltage supply lines are formed by the third metal wiring layer. This is a multi-layer wiring structure in which the signal lines are efficiently laid out so that the chip size of the memory is reduced.

(14) In the constitution outlined in (1) through (13) above, the second and third metal wiring layers are patterned without recourse to a phase shift mask scheme. This lowers the fabrication cost of the dynamic RAM.

(15) In the constitution outlined in (1) through (14) above, the dynamic RAM is fabricated in a triple well structure. In this structure, the p-type semiconductor substrate on which the dynamic RAM is mounted is fed with a relatively small negative potential as the substrate voltage. The n-channel MOSFETs constituting part of the memory arrays, sense amplifiers and sub-word line drivers are formed in the p-well region on the p-type semiconductor substrate. The n-channel MOSFETs constituting part of the peripheral circuit are formed in the p-well region supplied with the grounding potential inside the relatively deep n-well region fed with the supply voltage. The n-channel MOSFETs making up part of the data I/O circuits are formed in the p-well region supplied either with the grounding potential or with a negative potential of a relatively large absolute value inside the relatively deep n-well region fed with the supply voltage. The structure eliminates cut-off regions for well region isolation between the memory arrays on the one hand, and the sense amplifiers or sub-word line drivers on the other. This reduces the chip size of the dynamic RAM and removes the possibility of a latch-up hazard at the time of power application.

(16) In the constitution outlined in (1) through (14) above, the dynamic RAM is fabricated in another triple well structure. In this structure, the p-type semiconductor substrate on which the dynamic RAM is mounted is fed with the grounding potential as the substrate voltage. The n-channel MOSFETs constituting part of the memory arrays, sense amplifiers and sub-word line drivers are formed in the p-well region fed with a negative potential of a relatively small absolute value inside the relatively deep n-well region supplied with a word line selection potential. The n-channel MOSFETs making up part of the peripheral circuit are formed in the p-well region on the p-type semiconductor substrate. The n-channel MOSFETs constituting part of the data I/O circuits are formed in the p-well region supplied with the grounding potential or with a negative potential of a relatively large absolute value inside the relatively deep n-well region fed with the supply voltage. The structure eliminates cut-off regions for well region isolation between the memory arrays on the one hand, and the sense amplifiers or sub-word line drivers on the other. This reduces the chip size of the dynamic RAM and prevents fluctuations in the substrate voltage of the p-type semiconductor substrate from turning into noise propagating to the memory cells constituting the memory arrays.

(17) In the constitution outlined in (1) through (14) above, the dynamic RAM is fabricated in another triple well structure. In this structure, the p-type semiconductor substrate on which the dynamic RAM is mounted is fed with the grounding potential as the substrate voltage. The n-channel MOSFETs constituting part of the memory arrays and sub-word line drivers are formed in the p-well region fed with a negative potential of a relatively small absolute value inside the relatively deep n-well region supplied with a word line selection potential. The n-channel MOSFETs constituting part of the sense amplifiers and peripheral circuit are formed in the p-well region on the p-type semiconductor substrate. The n-channel MOSFETs constituting the data I/O circuits are formed in the p-well region supplied with the grounding potential or with a negative potential of a relatively large absolute value inside the relatively deep n-well region fed with the supply voltage. The structure prevents fluctuations in the substrate voltage of the p-type semiconductor substrate from turning into noise propagating to the memory cells; the structure also keeps the noise caused by sense amplifier operations from propagating to the memory cells. In particular, the possibility of a latch-up hazard is eliminated when power is applied.

(18) Given the major benefits mentioned in (1) through (17) above, the inventive dynamic RAM as a whole is boosted in operation speed, enhanced in the degree of circuit integration, enlarged in scale and reduced in fabrication cost.

Although the description above contains many specificities, these should not be construed as limiting the scope of the invention but as merely providing illustrations of the presently preferred embodiments of this invention. It is evident that many alternatives, modifications and variations will become apparent to those skilled in the art in light of the foregoing description.. For example, in FIG. 1, the dynamic RAM may have any number of memory blocks and may have any kind of bit configuration. The supply voltage may be at any potential level. The internal voltages VCH, VCL, HVC, VB1 and VB2 may take any potential levels unrestricted by the preceding embodiments of the invention. The block constitution of the dynamic RAM, the names and combinations of the start control signals used, and the structure of each memory block may be modified or varied as needed.

In FIG. 2, the substrate layout of the dynamic RAM and the shape of the semiconductor substrate are not restricted by the preceding embodiments. In FIGS. 3 and 4, each of the memory blocks MB0 through MB3 may have any number of sub-memory mats. The pairing combinations of the sub-memory mats and the layout directions of the various signal lines may be altered as desired. In FIGS. 5 and 6, the relation between the unit sub-word line driving circuits of the sub-word line driver and the memory array sub-word lines, and the relation between the sense amplifier unit circuits and the memory array sub-bit lines may be constituted by any line-circuit combinations. Each main word line may illustratively correspond to four sub-word lines, and each bit line selection signal may illustratively correspond to eight sub-bit lines.

In FIG. 7(A) through FIG. 9(B), the unit sub-word line driving circuits of the sub-word line driver may each be composed of a two-input CMOS NOR gate arrangement receiving the main word line MW30 and the sub-word line driving signals DX40 through DX43. In this alternative setup, each main word line is a single signal line, which further eases the layout pitch of the main word lines. The specific constitution of the unit sub-word line driving circuits may be altered as needed. In FIG. 10, the sense amplifier is not necessarily limited to the shared sense scheme. In FIGS. 10, 11 and 13, the driving MOSFETs P4, P8, P9 and NE in the sense amplifier driving circuit SAD may each be replaced by a plurality of driving MOSFETs arranged in parallel. The specific constitution of the sense amplifier SAR34, sense amplifier driver SDR34, etc., may be varied as needed. The conductivity type of the MOSFETs may be altered as needed when they are practiced.

In FIGS. 15 through 17, the layout positions and sequence of the signal lines, the number of metal wiring layers and the manner of using these components are not restricted by the preceding embodiments of the invention. In FIG. 18 through FIG. 23(C), the p-well region PW6 in which the data I/O circuit IO is formed may be supplied with the grounding potential VSS as the substrate voltage. It is not mandatory for the dynamic RAM to form the deep n-well region DNW2 in the layer under the p-well region PW6. Specific well structures, substrate voltage assignments and their combinations in the embodiments may be modified as needed.

Although the description above has centered on dynamic RAMs that fall within inventors' technical field, this is not limitative of the invention. The invention also applies to various integrated memory circuits such as synchronous DRAMs and static RAMs as well as to digital integrated circuits incorporating such integrated memory circuits. The invention applies extensively to semiconductor memories in which the layered structure of at least word lines, bit lines and common I/O lines proves effective as well as to apparatuses and systems incorporating such memories.

The principal advantages of this invention are recapitulated as follows: The invention provides a semiconductor memory such as a dynamic RAM having a memory mat divided into a plurality of units or sub-memory mats. Each sub-memory mat comprises: a memory array having sub-word lines and sub-bit lines intersecting orthogonally and dynamic memory cells located in lattice fashion at the intersection points between the intersecting sub-word and sub-bit lines; a sub-word line driver including unit sub-word line driving circuits corresponding to the sub-word lines; a sense amplifier including unit amplifier circuits and column selection switches corresponding to the sub-bit lines; and sub-common I/O lines to which designated sub-bit lines are connected selectively via the column selection switches. The sub-memory mats are arranged in lattice fashion. Above the sub-memory mats is a layer of: main word lines and column selection signal lines intersecting orthogonally, the main word lines having a pitch that is an integer multiple of the pitch of the sub-word lines, the column selection signal lines having a pitch that is an integer multiple of the pitch of the sub-bit lines; and main common I/O lines to which designated sub-common I/O lines are connected selectively.

In this memory setup, each of the unit sub-word line driving circuits in the sub-word line driver is a CMOS static driving circuit comprising: a p-channel first MOSFET which is furnished interposingly between the sub-word line driving signal line and the corresponding sub-word line and of which the gate is connected to an inverted signal line of the corresponding main word line; an n-channel second MOSFET which is furnished interposingly between the sub-word line and a grounding potential and of which the gate is connected to an inverted signal line of the corresponding main word line; and an n-channel third MOSFET which is furnished in parallel with the first MOSFET and of which the gate is connected to an uninverted signal line of the corresponding main word line. The sub-main amplifiers for selectively connecting the designated sub-common I/O lines to the main common I/O lines are each a pseudo-direct sense type sub-amplifier comprising: a read differential MOSFET of which the gate is connected to the uninverted and inverted signal lines of the corresponding sub-common I/O line and of which the drain is connected to the inverted and uninverted signal lines of the corresponding main common I/O line; and a write switching MOSFET furnished interposingly between the uninverted signal lines as well as between the inverted signal lines of the sub-common and main common I/O lines. The sub-main amplifiers are located in the region where the sub-word line driver and the sense amplifier intersect.

In the semiconductor memory of the constitution outlined above, the CMOS static driving circuit in each of the unit sub-word line driving circuits drives simultaneously to the active level both a row selection signal transmitted over the main word lines and a sub-word line driving signal transmitted via the sub-word driving signal lines. This arrangement speeds up sub-word line selecting operations. Because the sub-main amplifiers are pseudo-direct sense type sub-amplifiers located in the region where the sub-word line driver and the sense amplifier intersect, the read operation of the semiconductor memory such as the dynamic RAM is boosted without any increase in the memory layout area.

Furthermore, a comprehensive layered structure involving all word lines, bit lines and common I/O lines constitutes a semiconductor memory taking full advantage of the beneficial effects of the structure. This provides wholesale improvements in the operation speed, in the degree of circuit integration and in the scale of the semiconductor memory as well as sweeping reductions in its manufacturing cost.

What is claimed is:

1. A semiconductor memory comprising:

a first memory array having a plurality of first main word lines, a plurality of sets of first sub word lines, a plurality of pairs of first data lines, and a plurality of first memory cells each of which is coupled to a corresponding one of said plurality of first sub word lines and a corresponding one of said plurality of first data lines, each of said sets of first sub word lines corresponding to one of said plurality of first main word lines;

a second memory array having a plurality of second main word lines, a plurality of sets of second sub word lines, a plurality of pairs of second data lines, and a plurality of second memory cells each of which is coupled to a corresponding one of said plurality of second sub word lines and a corresponding one of said plurality of second data lines, each of said sets of second sub word lines corresponding to one of said plurality of second main word lines;

a third memory array having a plurality of third main word lines, a plurality of sets of third sub word lines, a plurality of pairs of third data lines, and a plurality of third memory cells each of which is coupled to a corresponding one of said plurality of third sub word lines and a corresponding one of said plurality of third data lines, each of said sets of third sub word line corresponding to one of said plurality of third main word lines;

a fourth memory array having a plurality of fourth main word lines, a plurality of sets of fourth sub word lines, a plurality of pairs of fourth data lines, and a plurality of fourth memory cells each of which is coupled to a corresponding one of said plurality of fourth sub word lines and a corresponding one of said plurality of fourth data lines, each of said sets of fourth sub word lines corresponding to one of said plurality of fourth main word lines;

a pair of first sub common data line extending in a first direction;

a pair of second sub common data line extending in said first direction;

a pair of third sub common data line extending in said first direction;

a pair of fourth sub common data line extending in said first direction;

a pair of first main common data line extending in a second direction perpendicular to said first direction;

a pair of second main common data line extending in said second direction;

a first switching circuit coupled between said plurality of pairs of first data lines and said pair of first sub common data line;

a second switching circuit coupled between said plurality of pairs of second data lines and said pair of second sub common data line;

a third switching circuit coupled between said plurality of pairs of third data lines and said pair of third sub common data line;

a fourth switching circuit coupled between said plurality of pairs of fourth data lines and said pair of fourth sub common data line;

a fifth switching circuit coupled between said pair of first sub common data line and said pair of first main common data line;

a sixth switching circuit coupled between said pair of second sub common data line and said pair of second main common data line;

a seventh switching circuit coupled between said pair of third sub common data line and said pair of first main common data line; and an eighth switching circuit coupled between said pair of fourth sub common data line and said pair of second main common data line.

2. A semiconductor memory comprising:

a first region extending in a first direction;

a second region extending in said first direction and in parallel with said first region;

a third region extending in a second direction perpendicular to said first direction;

a fourth region extending in said second direction and in parallel with said third region;

a fifth region formed as a rectangle of which three sides are contiguous to said first region, said third region and said fourth region;

a sixth region formed as a rectangle of which two sides are contiguous to said first region and said fourth region;

a seventh region formed as a rectangle of which four sides are contiguous to said first region, said second region, said third region and said fourth region; and an eighth region formed as a rectangle of which three sides are contiguous to said first region, said second region and said fourth region;

wherein said first region includes a pair of first sub common data line extending in said first direction and a pair of second sub common data line extending in said first direction, wherein said second region includes a pair of third sub common data line extending in said first direction and a pair of fourth sub common data line extending in said first direction, wherein said third region includes a pair of first main common data line extending in said second direction, wherein said fourth region includes a pair of second main common data line extending in said second direction, wherein said fifth region includes:

(1) a first memory array having a plurality of first word lines, a plurality of pairs of first data lines, and a plurality of first memory cells connected to said plurality of first word lines and said plurality of pairs of first data lines;

(2) a first sense amplifier connected to said plurality of pairs of first data lines; and (3) a first switching circuit connected interposingly between said plurality of pairs of first data lines and said pair of first sub common data line, wherein said sixth region includes:

(1) a second memory array having a plurality of second word lines, a plurality of pairs of second data lines, and a plurality of second memory cells connected to said plurality of second word lines and said plurality of pairs of second data lines;

(2) a second sense amplifier connected to said plurality of pairs of second data lines; and (3) a second switching circuit connected interposingly between said plurality of pairs of second data lines and said pair of second sub common data line, wherein said seventh region includes:

(1) a third memory array having a plurality of third word lines, a plurality of pairs of third data lines, and a plurality of third memory cells connected to said plurality of third word lines and said plurality of pairs of third data lines;

(2) a third sense amplifier connected to said plurality of pairs of third data lines; and (3) a third switching circuit connected interposingly between said plurality of pairs of third data lines and said pair of third sub common data line, wherein said eighth region includes:

(1) a fourth memory array having a plurality of fourth word lines, a plurality of pairs of fourth data lines, and a plurality of fourth memory cells connected to said plurality of fourth word lines and said plurality of pairs of fourth data lines;

(2) a fourth sense amplifier connected to said plurality of pairs of fourth data lines; and (3) a fourth switching circuit connected interposingly between said plurality of pairs of fourth data lines and said pair of fourth sub common data line, wherein said first region and said third region intersect in a region including:

(1) a fifth switching circuit connected interposingly between said pair of first sub common data line and said first main common data line; and (2) a sixth switching circuit for supplying said first sense amplifier with a supply voltage and a reference voltage, wherein said first region and said fourth region intersect in a region including:

(1) a seventh switching circuit connected interposingly between said pair of second sub common data line and said second main common data line; and (2) an eighth switching circuit for supplying said second sense amplifier with said supply voltage and said reference voltage, wherein said second region and said third region intersect in a region including:

(1) a ninth switching circuit connected interposingly between said pair of third sub common data line and said first main common data line; and (2) a tenth switching circuit for supplying said third sense amplifier with said supply voltage and said reference voltage, and wherein said second region and said fourth region intersect in a region including:

(1) an eleventh switching circuit connected interposingly between said pair of fourth sub common data line and said second main common data line; and (2) a twelfth switching circuit for supplying said fourth sense amplifier with said supply voltage and said reference voltage.

3. A semiconductor memory comprising:

a first memory array having a plurality of first word lines, a plurality of pairs of first data lines, and a plurality of first memory cells connected to said plurality of first word lines and said plurality of pairs of first data lines;

a second memory array having a plurality of second word lines, a plurality of pairs of second data lines, and a plurality of second memory cells connected to said plurality of second word lines and said plurality of pairs of second data lines;

a third memory array having a plurality of third word lines, a plurality of a pairs of third data lines, and a plurality of third memory cells connected to said plurality of third word lines and said plurality of pairs of third data lines;

a fourth memory array having a plurality of fourth word lines, a plurality of pairs of fourth data lines, and a plurality of fourth memory cells connected to said plurality of fourth word lines and said plurality of pairs of fourth data lines;

a pair of first sub common data line extending in a first direction;

a pair of second sub common data line extending in said first direction;

a pair of third sub common data line extending in said first direction;

a pair of fourth sub common data line extending in said first direction;

a pair of first main common data line extending in a second direction perpendicular to said first direction;

a pair of second main common data line extending in said second direction;

a first switching circuit connected interposingly between said plurality of pairs of first data lines and said pair of first sub common data line;

a second switching circuit connected interposingly between said plurality of pairs of second data lines and said pair of second sub common data line;

a third switching circuit connected interposingly between said plurality of pairs of third data lines and said pair of third sub common data line;

a fourth switching circuit connected interposingly between said plurality of pairs of fourth data lines and said pair of fourth sub common data line;

a first transmission circuit connected interposingly between said pair of first sub common data line and said pair of first main common data line, said first transmission circuit receiving first signals on said pair of first sub common data line and outputting second signals to said pair of first main common data line, said second signals being amplified signals of said first signals;

a second transmission circuit connected interposingly between said pair of second sub common data line and said pair of second main common data line, said second transmission circuit receiving third signals on said pair of second sub common data line and outputting fourth signals to said pair of second main common data line, said fourth signals being amplified signals of said third signals;

a third transmission circuit connected interposingly between said pair of third sub common data line and said pair of first main common data line, said third transmission circuit receiving fifth signals on said pair of third sub common data line and outputting sixth signals to said pair of first main common data line, said sixth signals being amplified signals of said fifth signals; and a fourth transmission circuit connected interposingly between said pair of fourth sub common data line and said pair of second main common data line, said fourth transmission circuit receiving seventh signals on said pair of fourth sub common data line and outputting eighth signals to said pair of second main common data line, said eighth signals being amplified signals of said seventh signals.

4. A semiconductor memory comprising:

a plurality of sub-memory mats, each of said sub-memory mats including: a memory array having sub-word lines and sub-bit lines intersecting orthogonally and dynamic memory cells located in lattice fashion at the intersection points between the intersecting sub-word and sub-bit lines; a sub-word line driver including unit sub-word line driving circuits corresponding to said sub-word lines; a sense amplifier including unit ampli-fier circuits and column selection switches corresponding to said sub-bit lines; and sub-common I/O lines to which the designated sub-bit lines are connected selectively via said column selection switches, wherein said sub-memory mats are arranged in lattice fashion;

a plurality of main word lines and column selection signal lines intersecting orthogonally above said sub-memory mats; and a plurality of main common I/O lines to which the designated sub-common I/O lines are connected selectively.

5. A semiconductor memory according to claim 4, wherein said unit sub-word line driving circuits are furnished alternately on both sides of said sub-word lines, said unit sub-word line driving circuits having a pitch twice that of said sub-word lines; and wherein said unit amplifiers and said column selection switches are provided alternately on both sides of said sub-bit lines, said unit amplifiers and said column selection switches having a pitch twice that of said sub-bit lines.

6. A semiconductor memory according to claim 5, wherein said unit sub-word line driving circuits are shared alternately by the corresponding sub-word lines of two adjacent sub-memory mats located in the column direction; and wherein said unit amplifiers and said column selection switches are shared alternately by the corresponding sub-bit lines of two adjacent sub-memory mats located in the row direction.

7. A semiconductor memory according to claim 6, wherein said main word lines have a pitch X times that of said sub-word lines, said semiconductor memory further comprising X bits of sub-word line driving signal lines intersecting said main word lines orthogonally, said sub-word line driving circuits selectively placing into selected status the corresponding sub-word lines in accordance with a row selection signal sent via the corresponding main word lines as well as in accordance with a sub-word line driving signal transmitted via the corresponding sub-word line driving signal lines.

8. A semiconductor memory according to claim 7, wherein each of said unit sub-word line driving circuits is a CMOS static driving circuit comprising: a p-channel first MOSFET which is furnished interposingly between the sub-word line driving signal line and the corresponding sub-word line and of which the gate is connected to an inverted signal line of the corresponding main word line; an n-channel second MOSFET which is furnished interposingly between the corresponding sub-word line and a grounding potential and of which the gate is connected to an inverted signal line of said corresponding main word line; and an n-channel third MOSFET which is furnished in parallel with said first MOSFET and of which the gate is connected to an uninverted signal line of said corresponding main word line.

9. A semiconductor memory according to claim 8, wherein said column selection signal lines have a pitch Y times that of said sub-bit lines, said semiconductor memory further comprising Y sets of said sub-common I/O lines corresponding to said sub-memory mats, said column selection switches being turned on selectively Y switches at a time in accordance with a column selection signal transmitted via the corresponding column selection signal lines.

10. A semiconductor memory according to claim 9, wherein said sub-common I/O lines are connected selectively to said main common I/O lines via sub-main amplifiers located in a region in which said sub-word line drivers and said sense amplifiers intersect.

11. A semiconductor memory according to claim 10, wherein each of said sub-main amplifiers comprises: a read differential MOSFET of which the gate is connected to the uninverted and inverted signal lines of the corresponding sub-common I/O line and of which the drain is connected to the inverted and uninverted signal lines of the corresponding main common I/O line; and a write switching MOSFET furnished interposingly between the uninverted signal lines as well as between the inverted signal lines of said sub-common I/O lines and said main common I/O lines.

12. A semiconductor memory according to claim 11, wherein said main common I/O lines are furnished in a layer above the region in which said sub-word line drivers are provided, said main common I/O lines intersecting orthogonally with said sub-common I/O lines.

13. A semiconductor memory according to claim 12, wherein said unit amplifiers are fed with operating power via a pair of driving signal lines, said sub-memory mats including sense amplifier driving circuits for selectively transmitting to said driving signal lines said operating power sent from a pair of driving voltage supply lines, said sense amplifier driving circuits being located in a region where said sub-word line drivers and said sense amplifiers intersect.

14. A semiconductor memory according to claim 13, wherein said sense amplifier driving circuits utilize an overdrive scheme whereby said driving signal lines are first supplied with operating power of a relatively large absolute value for a predetermined time and then with operating power of a relatively small absolute value.

15. A semiconductor memory according to claim 14, wherein said semiconductor memory adopts a charge-reused refresh method whereby the operating power transmitted to the driving signal lines of one sense amplifier is forwarded via appropriate switching means to the driving signal lines of the next sense amplifier to be operated.

16. A semiconductor memory according to claim 15, further comprising main bit lines which correspond to the sub-bit lines of a predetermined number of sub-memory mats arranged contiguously in the row direction and to which the sub-bit lines of the designated sub-memory mat are selectively connected, wherein said unit amplifiers of said sense amplifiers and said column selection switches are arranged to correspond with said main bit lines.

17. A semiconductor memory according to claim 16, further comprising a predetermined number of redundant sub-memory mats furnished in the row and the column direction thereof.

18. A semiconductor memory according to claim 17, wherein sense amplifier control signal lines for selectively connecting said driving signal lines to said driving voltage supply lines are located in a layer above the region in which said sense amplifiers are provided; and wherein said sub-word line driving signal lines, said main common I/O lines and said driving voltage supply lines are furnished in a layer above the region in which said sub-word line drivers are formed.

19. A semiconductor memory according to claim 18, further comprising three metal wiring layers, wherein said column selection signal lines, said sub-word line driving signal lines, said main common I/O lines and said driving voltage supply lines are formed by the third metal wiring layer which is the highest layer; and wherein said main word lines, said driving signal lines and said sense amplifier control signal lines are formed by the second metal wiring layer.

20. A semiconductor memory according to claim 19, wherein the layered structure including said main word lines, said driving signal lines, said sense amplifier control signal lines, said column selection signal lines, said sub-word line driving signal lines, said main common I/O lines and said driving voltage supply lines is patterned without recourse to a phase shift mask scheme.

21. A semiconductor memory according to claim 20, wherein said semiconductor memory is mounted on a p-type semiconductor substrate having data I/O circuits and fed with a relatively small negative potential;

wherein the n-channel MOSFETs constituting part of said memory arrays, said sense amplifiers and said sub-word line drivers are formed in a p-well region of p-type semiconductor substrate;

wherein the n-channel MOSFETs constituting part of peripheral circuits are formed in a p-well region supplied with said grounding potential inside a relatively deep n-well region fed with the supply voltage; and wherein the n-channel MOSFETs making up part of said data I/O circuits are formed in a p-well region supplied either with said grounding potential or with a negative potential of a relatively large absolute value inside said relatively deep n-well region fed with said supply voltage.

22. A semiconductor memory according to claim 20, wherein said semiconductor memory is mounted on a p-type semiconductor substrate having data I/O circuits and fed with said grounding potential;

wherein the n-channel MOSFETs constituting part of said memory arrays, said sense amplifiers and said sub-word line drivers are formed in a p-well region fed with a negative potential of a relatively small absolute value inside a relatively deep n-well region supplied with a word line selection potential;

wherein the n-channel MOSFETs making up part of peripheral circuits are formed in a p-well region of said p-type semiconductor substrate; and wherein the n-channel MOSFETs constituting part of said data I/O circuits are formed in a p-well region supplied either with said grounding potential or with a negative potential of a relatively large absolute value inside a relatively deep n-well region fed with the supply voltage.

23. A semiconductor memory according to claim 20, wherein said semiconductor memory is mounted on a p-type semiconductor substrate having data I/O circuits and fed with said grounding potential;

wherein the n-channel MOSFETs constituting part of said memory arrays and said sub-word line drivers are formed in a p-well region fed with a negative potential of a relatively small absolute value inside a relatively deep n-well region supplied with a word line selection potential;

wherein the n-channel MOSFETs constituting part of said sense amplifiers and peripheral circuits are formed in a p-well region on said p-type semiconductor substrate; and wherein the n-channel MOSFETs constituting part of said data I/O circuits are formed in a p-well region supplied either with said grounding potential or with a negative potential of a relatively large absolute value inside a relatively deep n-well region fed with the supply voltage.

* * * * *